United States Patent
Yamamoto et al.

(10) Patent No.: US 8,658,987 B2
(45) Date of Patent: Feb. 25, 2014

(54) CIRCUIT-PATTERN INSPECTION DEVICE

(75) Inventors: Takuma Yamamoto, Mito (JP); Takashi Hiroi, Yokohama (JP); Yusuke Ominami, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/577,719

(22) PCT Filed: Feb. 21, 2011

(86) PCT No.: PCT/JP2011/053686
§ 371 (c)(1),
(2), (4) Date: Aug. 8, 2012

(87) PCT Pub. No.: WO2011/102511
PCT Pub. Date: Aug. 25, 2011

(65) Prior Publication Data
US 2012/0305768 A1   Dec. 6, 2012

(30) Foreign Application Priority Data

Feb. 22, 2010 (JP) .................................. 2010-036077

(51) Int. Cl.
*G01N 23/225* (2006.01)
(52) U.S. Cl.
USPC ...... 250/442.11; 250/306; 250/307; 250/310; 250/311; 250/440.11
(58) Field of Classification Search
USPC ........ 250/306, 307, 310, 311, 440.11, 442.11
See application file for complete search history.

(56) References Cited

U.S. PATENT DOCUMENTS 5,502,306 A    3/1996  Meisburger et al.
6,744,057 B2 * 6/2004  Tanaka et al. .............. 250/491.1

(Continued)

FOREIGN PATENT DOCUMENTS

JP    5-258703 A    10/1993
JP    9-180667 A    7/1997

(Continued)

OTHER PUBLICATIONS

"Microelectronics and Nanometer Structures", Journal of Vacuum Science & Technology B, Nov./Dec. 1991, pp. 3005-3009, vol. 9, No. 6.

(Continued)

*Primary Examiner* — Michael Logie
(74) *Attorney, Agent, or Firm* — Crowell & Moring LLP

(57) ABSTRACT

Provided is a circuit-pattern inspection device which enables efficient inspection of a semiconductor wafer by selectively inspecting areas on the semiconductor wafer, such as boundaries between patterns thereon, where defects are likely to occur during the step of producing the semiconductor wafer while changing the beam scanning direction for each area. Two-dimensional beam-deflection control is employed for inspection operations in a continuous-stage-movement-type circuit-pattern inspection device in which only one-dimensional scanning has been employed conventionally. That is, by employing a combination of an electron-beam-deflection control in a first direction parallel to the stage-movement direction and an electron-beam-deflection control in a second direction intersecting the stage-movement direction, it is possible to obtain an image of any desired area for inspection that is set within a swath. The amplitude of deflection signals for the electron-beam-deflection and the rise and fall timings of the signals are suitably controlled according to inspection conditions.

15 Claims, 13 Drawing Sheets

(56) References Cited

U.S. PATENT DOCUMENTS

| | | |
|---|---|---|
| 7,439,503 B2 | 10/2008 | Abe |
| 7,982,186 B2* | 7/2011 | Kanai et al. .................. 250/306 |
| 8,212,227 B2* | 7/2012 | Watanabe et al. ........... 250/492.3 |
| 2005/0051724 A1* | 3/2005 | Nakasuji et al. .............. 250/310 |
| 2005/0121610 A1 | 6/2005 | Abe |
| 2009/0242761 A1* | 10/2009 | Yeh et al. ...................... 250/307 |
| 2012/0043462 A1* | 2/2012 | Yeh et al. ...................... 250/307 |

FOREIGN PATENT DOCUMENTS

| | | |
|---|---|---|
| JP | 2000-57985 A | 2/2000 |
| JP | 2003-31629 A | 1/2003 |
| JP | 2005-116795 A | 4/2005 |
| JP | 2008-53170 A | 3/2008 |
| JP | 2009-27190 A | 2/2009 |

OTHER PUBLICATIONS

"Microelectronics and Nanometer Structures", Journal of Vacuum Science & Technology B, Nov./Dec. 1992, pp. 2804-2808, vol. 10, No. 6.

International Search Report including English language translation dated May 17, 2011 (Five (5) pages).

* cited by examiner

CIRCUIT-PATTERN INSPECTION DEVICE

TECHNICAL FIELD

The present invention relates to a technique for defect inspection on substrates having fine circuit patterns, such as those of semiconductor devices and liquid crystal devices. More particularly, this invention relates to a technique for defect inspection on the substrate exemplified by the semiconductor wafer halfway through the process of semiconductor device production.

BACKGROUND ART

The conventional technique of the circuit-pattern inspection device is explained using the inspection of a semiconductor wafer as an example. The semiconductor device is produced by repeating the step of transcribing the circuit pattern formed on a photo mask onto the semiconductor wafer through lithography and etching processes. In the process of semiconductor device production, the quality of lithography and etching process and the generation of foreign material can significantly affect the yield of semiconductor devices. Thus in order to detect faults and abnormalities in the production process at an early stage or in advance, various devices (circuit-pattern inspection devices) are used to inspect defects in the circuit patterns over the semiconductor wafer during the production process.

Commercialized circuit-patter inspection devices include an optical defect inspection device that irradiates the semiconductor wafer with light to compare the same kind of circuit pattern between plural LSIs using optical images, and an electron beam defect inspection device that irradiates the semiconductor wafer with charged particle beam, such as an electron beam, to detect secondary or reflected electrons emitted from the radiated wafer before turning the detection signal into images, thereby detecting defects.

The electron beam defect inspection device performs defect inspection by comparing SEM (scanning electron microscope) images. There exist two methods for obtaining SEM images: the method of obtaining the images by moving a stage in a stepped and repeated manner and by scanning an electron beam two-dimensionally at each position where the stage is stopped, and the method of obtaining the images continuously by shifting the stage in a scanning movement at a constant velocity in a given direction while simultaneously applying an electron beam for scanning one-dimensionally in the direction of stage movement and in the vertical direction. Most electron beam defect inspection devices utilize the latter method that offers better throughput. Non-Patent Literature 1, Non-Patent Literature 2, Patent Literature 1, and Patent literature 2 below disclose a method for irradiating a conductive substrate with an electron beam at least 100 times as intense (10 nA or higher) as that of the ordinary SEM, detecting secondary, reflected, or transmitted electrons emitted from the substrate, and comparing and inspecting images between adjacent same patterns formed by the signal of detected electrons.

DOCUMENTS ON PRIOR ARTS

Patent Document

Patent Literature 1: Japanese Unexamined Patent Application Publication No. HEI5-258703
Patent Literature 2: U.S. Pat. No. 5,502,306

Non Patent Document

Non Patent Literature 1: J. Vac. Sci. Tech. B, Vol. 9, No. 6, pp. 3005-3009 (1991)
Non Patent Literature 2: J. Vac. Sci. Tech. B, Vol. 10, No. 6, pp. 2804-2808 (1992)

DISCLOSURE OF THE INVENTION

Problems to be Solved by the Invention

Advances in the miniaturization of the size of circuit-patterns formed on the semiconductor wafer (substrate) have given rise to the need for optical or electron beam defect inspection devices to perform inspection using images at higher magnifications than ever. However, the use of highly magnified images reduces the area that can be inspected per unit time. This makes it necessary to improve the efficiency of inspection by selectively inspecting areas where defects are likely to occur.

In the process of semiconductor wafer production, defects are highly likely to occur near areas where pattern density varies significantly such as boundaries between memory mats formed on the wafer.

There may be different directions (longitudinal direction of patterns in particular) in which many circuit patterns are found in the areas where defects are likely to occur, such as peripheral circuits near the top and button edges or the right and left edges of the memory mats relative to the wafer along the boundary between memory mats. In such cases, there exist different optimal beam scanning directions in which to inspect the respective areas.

However, with the circuit pattern inspection device operating on the conventional method of continuous stage-movement, the degree of freedom in setting inspection areas is limited because images of the wafer are obtained following the setting of an electron-beam irradiation area called a swath, to be discussed later. Furthermore, because the direction of beam scanning cannot be changed for inspecting different inspection areas with the conventional method, beam scanning is performed in a direction not optimal for inspecting some inspection areas. Although step-and-repeat inspection devices would offer relatively high degrees of freedom in setting inspection areas, they are not practical because of their limited throughput. Thus conventional circuit-pattern inspection devices have the problem of efficiently inspecting the areas where defects are likely to occur.

An object of the present invention is to provide a circuit-pattern inspection device which can efficiently obtain an image of any desired area for inspection in a swath.

Means for Solving the Problem

The problem above is solved by the present invention employing a two-dimensional beam-deflection control for inspection operations in a continuous-stage-movement-type circuit-pattern inspection device in which only one-dimensional scanning has been employed conventionally.

That is, according to the present invention, by employing a combination of an electron-beam-deflection control in a first direction parallel to the stage-movement direction and an electron-beam-deflection control in a second direction intersecting the first direction, it is possible to obtain an image of any desired area for inspection that is set within a swath. Waveforms of deflection signal of the electron beams in the first and the second directions are controlled according to inspection conditions (that is, the velocity of stage-movement and electron-beam scanning conditions such as the size of areas for inspection, beam deflection frequency, frame integration count, and the presence or absence of pre-scan).

Images of areas other than the area for inspection may or may not be obtained. Preferably, the electron beam may be controlled and deflected in such a manner that only the image of the set area for inspection is obtained.

Advantageous Effects of the Invention

According to the present invention, efficient inspection of semiconductor wafers (substrates) can be implemented because the present invention makes it possible to selectively inspect areas of semiconductor wafers where defects are likely to occur, such as pattern boundaries, in a process of producing semiconductor wafers.

DESCRIPTION OF EMBODIMENTS

Some embodiments of the present invention are explained below in detail with reference to the accompanying drawings.

Figure 2A:
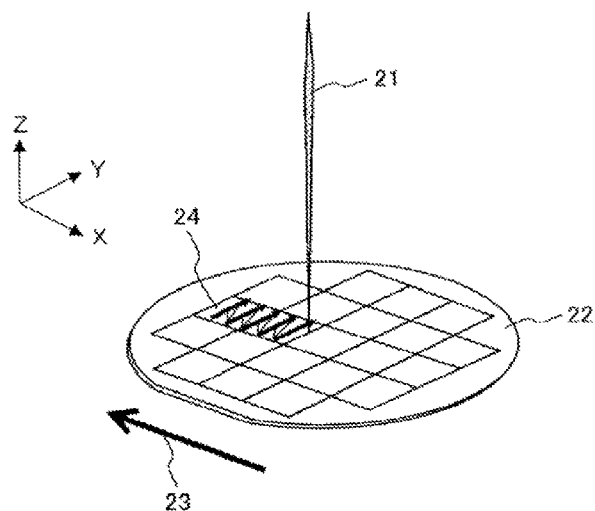
FIG. 2A is a schematic view showing a trajectory of an electron beam in a conventional electron-beam wafer inspection device.
Figure 2B:
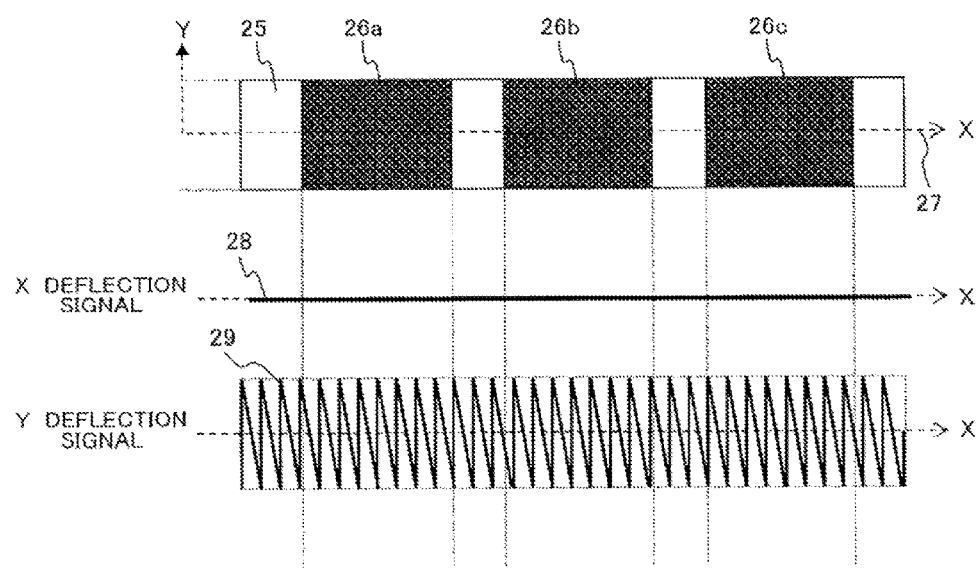
FIG. 2B is a schematic view showing inspection areas, an X deflection signal, and a Y deflection signal in the conventional electron-beam wafer inspection device.

First of all, with reference to FIGS. 2A and 2B, the inspection method of the conventional electron-beam wafer inspection device is described as a comparative example with regard to the ensuing embodiments. In the description below, the direction of stage movement will be defined as the X-axis direction and the direction perpendicular to the direction of stage movement within a wafer surface will be defined as the Y-axis direction. In FIG. 2B and subsequent drawings, the leftward direction on the paper stands for the negative X direction, the rightward direction for the positive X direction, the upward direction for the positive Y direction, and the downward direction for the negative Y direction.

FIG. 2A shows a trajectory of an applied electron beam on a wafer. The electron beam 21 is applied onto the wafer 22 while scanning continuously in the Y direction by a deflector which is not shown. At this time, a stage, not shown, is moved in the negative X direction moving the wafer 22 in the negative X direction as indicated by arrow 23. This causes the electron beam 21 to be applied onto the wafer 22 along a trajectory indicated by arrow 24.

FIG. 2B shows a part of the inspection areas on the wafer, and an X deflection signal and a Y deflection signal for scanning the inspection areas with the electron beam. In the ensuing embodiments, the term "swath" will refer to an area corresponding to the trajectory plotted by the electron beam scanning the wafer over a predetermined width in a single continuous stage-movement. A single stage movement signifies a continuous movement of the stage that starts moving in the longitudinal direction of a given swath from a resting state to a completion of the movement. In the ensuing descriptions, irradiation of the area corresponding to the swath with the electron beam may be called a "swath" where appropriate.

In FIG. 2B, a swath 25 includes plural inspection areas 26a, 26b and 26c. An X deflection signal 28 is a signal for scanning with the electron beam in the X direction, and a Y deflection signal 29 is a signal for scanning with the electron beam in the Y direction. The vertical axes for the X deflection signal and Y deflection signal in the FIG. 2B correspond to the deflection voltage of the deflector, and the horizontal axes for these signals correspond to positions in the X-axis. The width of the swath 25 (length in the Y direction in the case of FIG. 2B) corresponds to the scanning width of a primary scan of the electron beam.

A single stage movement carries out scanning of the swath 25. At this time, the applied position of the electron beam with the X deflection signal 28 and Y deflection signal 29 at zero moves from the negative X direction to the positive X direction (from left to right in FIG. 2B) over the wafer along a broken line 27 indicating the center of the swath 25. From now on, "the applied position of the electron beam with the X deflection signal and Y deflection signal at zero," i.e., the projected position of the center axis (electron beam optical axis) of an electron optics column furnished in the inspection device over the specimen will be called "the electron beam reference position."

In FIG. 2B, the X deflection signal 28 and Y deflection signal 29 represent deflection signal amounts of the deflector in the X and Y directions, respectively, corresponding to the location of the swath 25. According to the conventional inspection method, the X deflection signal in the direction (X direction) parallel to the direction of stage movement is always zero. Thus, the electron beam is deflected solely by the Y deflection signal 29 in the direction (Y direction) perpendicular to the direction of stage movement.

Next, the relationship is explained between the velocity of stage movement and the deflection velocity of the electron beam. In the case of FIG. 2B, in order to obtain all images of the swath 28 through the scanning of primary charged particle beam, the stage need only be moved by the length of a single scanning line (by the length of one pixel) in the direction of stage movement during a single round trip of the electron beam in the direction of primary scanning (Y direction in the case of FIG. 2B), i.e., during the time required to complete a single scanning line. The time required to scan one scanning line with primary charged particle beam is equal to 1/f, where f denotes the deflection frequency of the deflector. Usually, the detector of secondary or reflected electrons attached to the inspection device outputs image data corresponding to one scanning line per 1/f mentioned above. Thus the time 1/f is equal to the time of image detection per line. For the inspection device operating on the continuous-stage-movement-type, the stage velocity is usually set to a velocity that allows the stage to move by one pixel size during the above-mentioned time 1/f. In the ensuing description, the stage velocity above will be referred to as the normal stage velocity which, indicated by reference character $V_0$, is synchronous with beam scanning.

Embodiment 1

In embodiment 1, a circuit-pattern inspection device is explained which is equipped with the function of controlling electron-beam-deflection in a manner suitable for inspecting any desired partial area over memory mats. As mentioned above, defects occurring in the semiconductor chip tend to concentrate on some areas such as memorymat edges. Thus, if the locations where defects are likely to occur are assumed beforehand and if only images of the target areas are obtained for inspection, the load of image processing is alleviated and inspection can be accomplished more efficiently than before. The control of beam deflection with the embodiment 1 constitutes a basic mode of beam-deflection control to be implemented in the ensuing embodiments.

Figure 1:
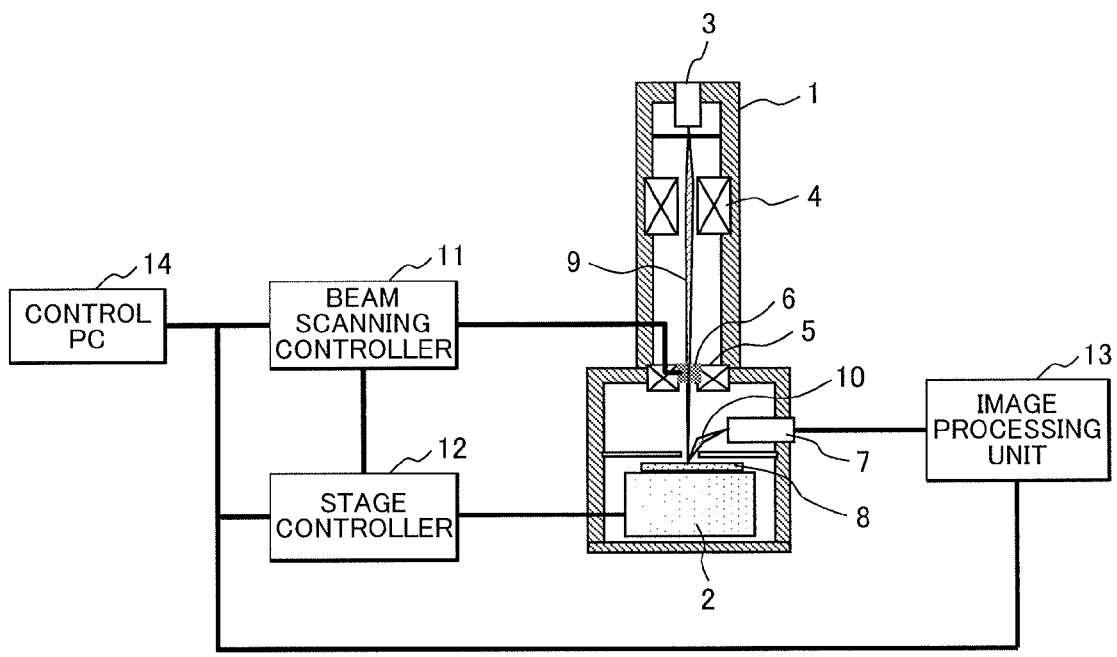
FIG. 1 is a schematic view illustrating a configuration of a circuit-pattern inspection device in the embodiment 1.

FIG. 1 is a schematic view of an electron-beam wafer inspection device as a typical circuit-pattern inspection device in the embodiment 1. The main body of this electron-beam wafer inspection device includes a column 1 as an electron optics system, and an XY stage 2 on which a wafer (substrate) 8 is placed. The column 1 serves as an electron-beam scanning unit for scanning the wafer with electron beam. Circuit patterns are formed on the wafer 8. The electron-beam wafer inspection device further includes a beam scanning controller 11, a stage controller 12, and an image processing unit 13.

The column 1 has an electron gun 3 for generating the irradiating electron beam (also called simply "the electron beam" hereunder) 9, a condenser lens 4 and an objective lens 5 for focusing the electron beam 9 on the wafer 8, a deflector 6 for scanning the wafer 8 with the electron beam 9, and a secondary electron detector 7 for detecting secondary electrons 10 emitted from the wafer 8.

The deflector 6 deflects the electron beam 9 to scan the wafer 8 in accordance with signals (X deflection signal and Y deflection signal) from the beam scanning controller 11. The XY stage 2 moves according to signals from the stage controller 12, allowing the wafer 8 to move relative to the column 1.

The beam scanning controller 11 incorporates a sequencer that generates signal patterns of the X deflection signal and Y deflection signal reflecting diverse scanning patterns. The beam scanning controller 11 transmits the X deflection signal and Y deflection signal thus generated to the deflector 6 to control the scanning and deflection of the electron beam 9. The stage controller 12 sends signals to the XY stage 2 for movement control of the XY stage 2.

Also, the signals from the secondary electron detector 7 are transmitted to the image processing unit 13. The image processing unit 13 performs image processing for defect detection by linking the signals from the secondary electron beam detector 7 with position information from the beam scanning controller 11 and stage controller 12. Specifically, the image processing unit 13 turns the signals from the secondary electron detector 7 into an image of a given circuit pattern, and compares this image with other images of the same circuit pattern to detect circuit pattern defects. The beam scanning controller 11, stage controller 12, and image processing unit 13 are controlled by a control PC 14. The control PC 14 is further equipped with a screen display unit and a pointing device such as a mouse, the screen display unit displaying a setting screen through which diverse settings for operating the device may be input. By use of the setting screen above, the operator of the device sets and registers diverse information including the settings of inspection areas.

Figure 3A:
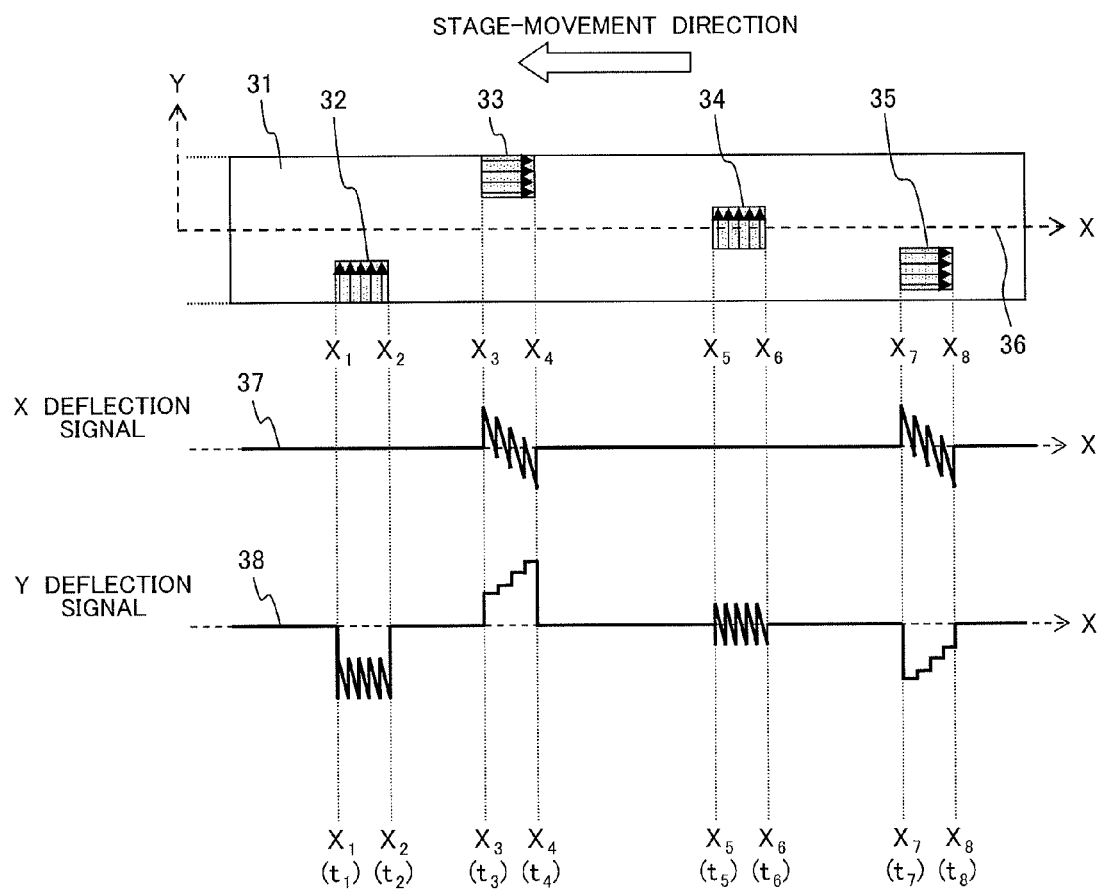
FIG. 3A is a schematic view showing inspection areas, an X deflection signal, and a Y deflection signal in the circuit-pattern inspection device in the embodiment 1.
Figure 3B:
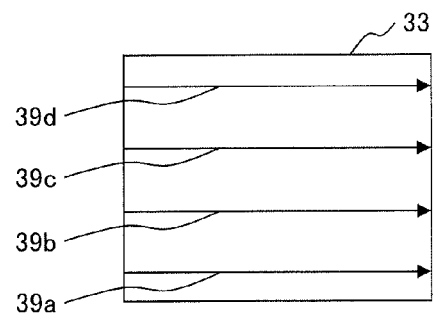
FIG. 3B is a schematic view showing a way of an electron-beam scanning in an inspection area in the circuit-pattern inspection device in the embodiment 1.

With reference to FIGS. 3A and 3B, the control of electron-beam-deflection is explained in the circuit-pattern inspection device of the embodiment 1.

FIG. 3A shows a typical swath set on the wafer, along with a typical X deflection signal and a typical Y deflection signal for scanning with the electron beam. The vertical axes for the X deflection signal and Y deflection signal in the figure represent deflection voltage. The horizontal axes for the signals are indicated by X direction positions over inspection areas so as to correspond with X direction positions of the swath, also being indicated by time information for better understanding.

In the embodiment 1, inspection areas 32, 33, 34 and 35 are assumed to be set over a swath 31 as the areas for inspecting the bottom part, top part, center, and a desired part of the swath, respectively.

For purpose of simplification, the inspection areas 32, 33, 34 and 35 are assumed to be rectangular in shape. It is also assumed that during scanning of the swath 31, the scanning velocity of the electron beam (pixel sampling frequency) is constant and that the stage velocity is synchronous with the scanning velocity. As indicated by a white arrow, the stage is moved in the negative X direction so that the wafer is moved from the positive X direction to the negative X direction.

The swath 31 is carried out by a single stage movement. Because the stage is moved in the negative X direction, the electron beam reference position is moved along a dotted line 36 indicative of the center of the swath 31 from the negative X direction to the positive X direction over the wafer (from left to right in FIG. 3A). The arrows in the inspection areas 32, 33, 34 and 35 indicate the directions in which the electron beam is applied for scanning. In the inspection areas 32 and 34, the electron beam is applied for scanning in the direction perpendicular to the direction of stage movement (Y direction). In the inspection areas 33 and 35, the electron beam is applied for scanning in the direction parallel to the direction of stage movement (X direction). The settings above of the scanning directions are only an example; the scanning directions may be set as desired over each inspection area. For example, the electron beam may be applied for scanning in the X direction over the inspection area 32 and in the Y direction over the inspection area 35.

Hereinafter, the signal waveforms of the X deflection signal 37 and the Y deflection signal 38 are explained. The X deflection signal 37 and the Y deflection signal 38 are applied to the deflector 6 during scanning of the inspection areas 32, 33, 34 and 35 with the electron beam. It is assumed that the X deflection signal 37 is positive in direction when the electron beam shifts in the positive X direction (to the right in FIG. 3A) and that the Y deflection signal 38 is positive in direction when the electron beam shifts in the positive Y direction (upward in FIG. 3A).

First, the method of electron-beam scanning over the inspection area 32 is explained. When stage movement causes the applied position of the electron beam to reach the intersection point between a position $X_1$ and the centerline 36 of the swath 31 at time $t_1$, electron-beam scanning is started in the Y direction. As illustrated, the inspection area 32 is set on the lower side (edge in the negative Y direction) of the swath 31, and the direction of electron-beam scanning is set to be in the Y direction. As a result, the signal waveform of the Y deflection signal 38 takes on a sawtooth waveform signal pattern whose scanning width is equal to the Y direction length of the inspection area 32, supplemented with an offset signal extending in the negative direction from the center of the swath 31 to the scanning start point (bottom left corner of the inspection area 32). Since scanning is not performed in the X direction, the X deflection signal 37 remains unchanged.

When the applied position of the electron beam reaches a position X2 at time $t_2$, the electron-beam scanning over the inspection area 32 is terminated.

Next, the procedure for scanning the inspection area 33 is explained. FIG. 3B may be referenced as needed for purpose of supplementary explanation. The inspection area 33 is set so that the upper edge of the scanning area comes into contact with the upper edge of the swath (edge in the positive Y direction). The direction of electron-beam scanning is set to be in the X direction. When the applied position of the electron beam reaches the left edge (X3) of the inspection area 33 at time $t_3$, electron-beam scanning is started in the X direction. FIG. 3B shows how the inspection area 33 is scanned with the electron beam. As shown in FIG. 3B, the inspection area 33 is scanned with the electron beam indicated by arrows 39a, 39b, 39c and 39d in this order from the bottom.

In the case of the electron beam scan indicated by arrow 39a, the electron beam reference position is at a position X3 at time $t_3$. Thus the X deflection signal 37 corresponding to arrows 39a through 39d takes on a sawtooth waveform deflection signal pattern whose signal amplitude corresponds to the X direction size of the area 33 (X4−X3), supplemented with a monotone decreasing signal pattern in the negative X direction in synchronism with the stage velocity. The rises in the sawtooth waveform constitute electron beam scans in the positive X direction and the falls make up returning deflections in the direction of stage movement (in negative X direction).

Because the stage moves in the negative X direction, the applied position of the electron beam is shifted slightly to the right of the position X3 by the time the scan indicated by arrow 39a in the X direction is completed. Thus the scanning start position of the next scanning line 39b is made to coincide with the position X3 over the wafer by beam deflection in the same direction as that of stage movement (returning deflection). The reason the beam deflection in the positive X direction is needed despite the movement of the stage is that since the stage velocity is low (i.e., stage is moved only by about one pixel during the time of beam deflection executed in the positive X direction), the movement of the stage with the beam deflection stopped in the positive X direction cannot complete the scanning of the X direction size of the area 33 (X4−X3).

Thereafter, upon completion of each scanning line in the X direction, a returning deflection process is performed to make the start position of the next scanning line coincide with the position X3, whereby beam deflections in the X direction along arrows 39b through 39d are controlled to be executed successively. As scanning proceeds from arrow 39a to arrow 39d, the beam deflection start time of each scanning line in the X direction is appreciably distanced from the scanning start time $t_3$ of the area 33. Thus the amount of returning deflection with regard to each scanning line is determined in accordance with the elapsed time from the scanning start time $t_3$ of the area 33.

Meanwhile, when the scan of arrow 39a is started at time $t_3$, the Y deflection signal 37 is impressed with a positive offset signal whose magnitude corresponds to the position where arrow 39a exists in the Y direction (i.e., distance between the centerline 36 of the swath 31 and arrow 39a). Since beam deflection in the Y direction is not performed during the scan of arrow 39a, the Y deflection signal 37 remains unchanged during scanning of the electron beam along arrow 39a. Upon completion of the X direction beam deflection of arrow 39a, the applied position of the beam is shifted upward in keeping with the Y coordinate position of arrow 39b that is the next scanning line. The above-described beam deflection is also performed on the scanning lines corresponding to arrows 39c and 39c, so that the Y deflection signal 37 takes on a stepped waveform signal pattern as shown in FIG. 3A. Upon completion of the scanning of the area 33 at $t_4$, the Y deflection signal 37 is returned to zero. As the number of scanning lines increases, the stepped wave form signal pattern shown in FIG. 3A approaches a linear-function signal pattern that monotonously increases or decreases.

The inspection area 34 is inspected in the same manner as the inspection area 32 of which the direction of electron-beam scanning is the same, and the inspection area 35 is inspected in the same manner as the inspection area 33 of which the direction of electron-beam scanning is the same. Thus the inspection areas 34 and 35 will not be discussed further in detail.

According to the embodiment 1 explained above, it is possible to implement a circuit-pattern inspection device operating on the continuous-stage-movement-type capable of inspecting any desired areas over the wafer. The embodiment 1 is explained above on the assumption that images of areas in the swath 31 other than the inspection areas 32 through 35 are not obtained. Theoretically, however, it is possible to obtain images of areas other than the inspection areas and, when each inspection area is reached for scanning, to change the scanning direction to obtain the image of the inspection area in question.

Embodiment 2

In the embodiment 1, the control of beam deflection is explained when the stage velocity is synchronous with the beam scanning velocity. However, if only parts of the swath are set to be inspection areas, i.e., if a majority of areas in the swath are not irradiated with the electron beam for inspection, then those areas not irradiated with the electron beam may be skipped with an increased stage velocity. Such an arrangement can be very advantageous for an inspection speedup. In the embodiment 2, the configuration of an inspection device is explained which can move the stage at high velocity in a manner asynchronous with the beam scanning velocity. Because the hardware configuration of the embodiment 2 is approximately the same as that of the embodiment 1, FIG. 1 will be cited as needed in the ensuing description.

Figure 4A:
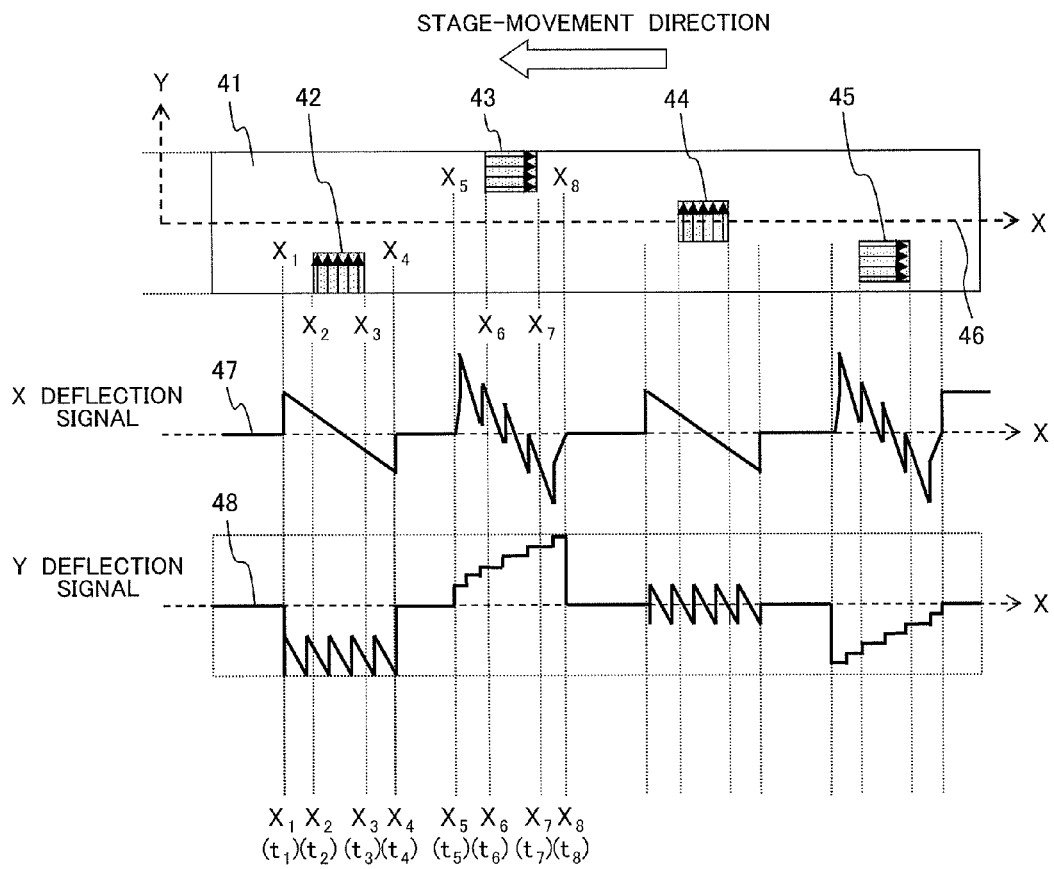
FIG. 4A is a schematic view showing inspection areas, an X deflection signal, and a Y deflection signal in a circuit-pattern inspection device in the embodiment 2.
Figure 4B:
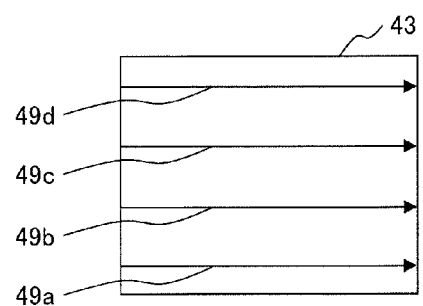
FIG. 4B is a schematic view showing a way of an electron-beam scanning in an inspection area in the circuit-pattern inspection device in the embodiment 2.

FIG. 4A is a schematic view showing a swath set on the wafer, along with an X deflection signal and a Y deflection signal configured to permit stage movement at high velocity. FIG. 4B is a schematic view showing how scanning lines are typically arranged over an inspection area.

As in the embodiment 1, a swath 41 has plural inspection areas 42, 43, 44 and 45 set therein. The setting conditions for the inspection areas such as their arrangement and shape are the same as those for the inspection areas 32 through 35 explained in the embodiment 1. In the inspection areas 42 and 44, the electron beam is applied for scanning in the direction perpendicular to the direction of stage movement (i.e., Y direction); in the inspection areas 43 and 45, the electron beam is applied for scanning in the direction parallel to the direction of stage movement (X direction). As in the embodiment 1, the stage is moved in the negative X direction, so that the wafer is moved from the positive X direction to the negative X direction. Unlike in the embodiment 1, the electron beam is not applied to any areas other than the inspection areas 42, 43, 44 and 45 in the embodiment 2. Therefore, the "swath" of the embodiment 2, which also includes areas to which the electron beam is not applied, is defined as a virtual area unlike a conventional "swath," the virtual area being formed by the product of the distance of a single continuous stage-movement and a given beam deflection width (width of electron-beam movement, not the scanning width) when the beam deflection width is set in the direction intersecting the direction of stage movement (e.g., Y direction in FIG. 4A). In actual inspection, the swath width that can be set is limited by a maximum visual field size of the electron optics column (maximum deflection length within a range where off-axis astigmatism is negligible). Also, in order to inspect plural inspection areas by a single stage movement, the width of the swath needs to be set to include these inspection areas (e.g., areas 42 and 43). Thus, the concept of "swath" still remains effective even if it is a virtual area. When a recipe is set, an optimal swath for inspection is automatically calculated by the device based on the inspection areas assigned by the device operator and on the set value of the beam changing width.

What follows is the resumed explanation of the actual control of beam deflection. In the embodiment 2, the stage velocity is set to be higher than a normal synchronous velocity (e.g., V; V>$V_0$). In order not to lower inspection throughput, the stage velocity and beam scanning velocity (i.e., deflection frequency of the deflector 6) are kept unchanged during electron-beam scanning of each area. In the case of the embodiment 1, the stage velocity and beam scanning velocity are synchronized so that beam deflection is started when the electron beam reference position reaches the edges of each scanning area, such as positions X1 and X3. That is, the scanning start position and the beam deflection start time coincide with each other over the inspection areas. In the case of the embodiment 2, by contrast, the stage velocity and beam scanning velocity are asynchronous. If the beam deflection start time were set in keeping with the electron beam reference position and with the synchronized time of the scanning start position over the inspection area as in the case of FIG. 3A, electron-beam scanning would not end between the time the electron beam reference position passes the left edge of the inspection area and the time the electron beam reference position passes the right edge of the area.

The simplest idea to overcome the above bottleneck is as follows: the actual time for the electron beam to scan the inspection area (i.e., time obtained by dividing the total scanning distance in the inspection area by the scanning velocity) is the time necessary for image acquisition and cannot be increased or reduced. Meanwhile, the distance over which the wafer is moved during the beam scanning time becomes longer than the length of the direction of stage movement over the inspection area because the stage moves asynchronously at high velocity.

Thus the beam deflection start time is set to be earlier and the beam deflection end time to be later than usual in keeping with the beam scanning velocity. The displacement between the electron beam reference position and the inspection area (position where the electron beam should originally scan) because of the shifted start time and end time is absorbed by the beam deflection in the X direction. Beam-deflection control based on this idea makes it possible to obtain the image of the necessary area while allowing the stage to move at high velocity.

With reference to FIGS. 4A and 4B, the above-mentioned concept is explained below. First, the method of electron-beam scanning over the inspection area 42 is explained. The inspection area 42 is set to be in contact with the lower edge of the swath 41 and is scanned in the Y direction. Thus the beam deflection start time $t_1$ for the Y deflection signal 48 upon scanning of the inspection area 42 is set to be earlier than time $t_2$ at which the electron beam reference position passes the left edge X2 of the inspection area 42. At this time, over the actual wafer, the electron beam reference position is found at the position X1 shifted before (in negative X direction of) the left edge X2 of the inspection area 42. In order to eliminate this displacement between the position X1 and the position X2, an offset is overlaid on the X deflection signal 47 at time $t_1$, the offset being one whose deflection length corresponds to (X2−X2) and whose polarity is the positive X direction. This eliminates the displacement of the beam-scanning position at the beam deflection start time $t_1$. Likewise, the beam deflection end time $t_4$ for the X deflection signal 47 or Y deflection signal 48 is set to be later than time $t_3$ at which the electron beam reference position passes the right edge X3 of the inspection area 42. The displacement occurring at this time between the electron beam reference position and the right edge X3 of the inspection area 42 is also eliminated by overlaying an offset whose deflection length corresponds to (X4−X3) and whose polarity is the negative X direction onto the X deflection signal 47.

After being overlaid with the offset at time $t_1$, the X deflection signal 47 is supplemented continuously with a signal for correcting the difference between the electron beam reference position and the scanning target position inside the inspection area 42. The amount of displacement between the electron beam reference position and the position where the beam should originally be applied varies depending on the elapsed time multiplied by the difference between the stage velocity and the beam scanning velocity. For this reason, the amount of correction of the X deflection signal 47 decreases monotonously as the scanning of the inspection area 42 progresses. In terms of distance, setting an earlier beam deflection start time is equivalent to starting electron-beam scanning by a margin of a predetermined distance. However, because the stage velocity is higher than the beam scanning velocity, the movement of the (original) applied position of the beam resulting from stage movement gradually catches up with the movement of the electron beam reference position resulting from beam scanning. At a certain point in time, the margin is exhausted and reduced to zero. In subsequent scanning, the movement of the electron beam reference position resulting from beam scanning gradually falls behind the movement of the applied position of the beam resulting from stage movement. At the beam deflection end time, the electron beam reference position ends up the position X4 on the right of the position X3 where the electron beam should originally be applied (i.e., behind the direction of stage movement).

In the example shown in FIG. 4A, the control conditions for beam deflection are set so that the position where the above-mentioned distance margin is exhausted (i.e., position where the applied position of the beam should be originally scanned coincides with the electron beam reference position) comes to the center of the inspection area 42. That is, on the left side of the inspection area 42, the target scanning line always comes to the right of the electron beam reference position; on the right side of the inspection area 42, the target scanning line always comes to the left of the electron beam reference position. Thus on the left side of the inspection area 42, the amount of correction of the X deflection signal 47 is always positive; on the right side of the inspection area 42, the amount of correction of the X deflection signal 47 is always negative. When the control conditions for beam deflection are set in this manner, the positions X1 and X4 and the positions X2 and X3 become symmetrical to each other, so that the timing control over the X deflection signal and Y deflection signal is extremely simplified. This makes it possible to easily implement bidirectional inspection in the positive and negative directions through stage movement while optimizing the velocity of inspection.

When the conditions for beam deflection are set so that the positions X1 and X4 become symmetrical to each other, the positions X1 and X4 can be calculated on the basis of the following relations: if the stage velocity V of this embodiment is assumed to be a times the normal stage velocity $V_0$ ($V = \alpha V_0; \alpha > 1$), the same scanning time as the scan from the position X2 to the position X3 over the inspection area 42 at the normal stage velocity V is ensured by setting $(X4-X1)/(X3-X2) = \alpha$. Also, the likelihood of the X deflection signal 47 with regard to the limit on a maximum deflection amount is ensured by setting $(X2-X1) = (X4-X3)$. On the basis of these relations, the scanning start position X1 and scanning end position X4 are determined. In the ensuing description, the ratio $\alpha$ between the stage-movement velocity V and the normal stage velocity $V_0$ will be called the velocity coefficient of stage movement.

Next, the control of beam deflection on the inspection area 43 is explained. The inspection area 43 is set to be in contact with the upper edge of the swath 41. Although the inspection area 43 is scanned in the X direction, the basic idea of performing beam-deflection control on the inspection area 43 is similar to that on the inspection area 42. That is, a beam deflection start time $t_5$ for the X deflection signal 47 and Y deflection signal 48 is set to be earlier than time $t_6$ at which the electron beam reference position passes the left edge X2 of the inspection area 43. Also, a beam deflection end time $t_8$ for the X deflection signal 47 and Y deflection signal 48 is set to be later than time $t_7$ at which the electron beam reference position passes the position X7 as the right edge of the inspection area 43.

Next, the signal waveforms of the X deflection signal 47 and Y deflection signal 48 are explained. The X deflection signal 47 and the Y deflection signal 48 are applied to the deflector 6 during scanning of the inspection area 43 with the electron beam.

FIG. 4B is a schematic view showing how the inspection area 43 is scanned with the electron beam. As shown in FIG. 4B, the inspection area 43 is scanned with the electron beam indicated by arrows 49a, 49b, 49c and 49d in this order. As in the embodiment 1, the X and Y deflection signals corresponding to arrows 49a through 49d basically constitute a sawtooth waveform signal pattern in the scanning direction and a stepped waveform signal pattern in the direction intersecting the scanning direction. The sawtooth waveform deflection signal pattern having the signal amplitude corresponding to the X direction size (X7–X6) of the area 43 has a shape supplemented with a monotonous decreasing signal pattern in the negative X direction in synchronism with the stage velocity. The rises in the sawtooth waveform make up electron beam scans in the positive X direction and the falls therein constitute returning deflections in the direction of stage movement (in negative X direction).

At the deflection start time (time $t_5$) of the electron beam indicated by arrow 49a, the electron beam reference position is at the position X shifted to the left, by (X6–X5), of the left edge of the inspection area 43 which should originally be scanned with the electron beam. For this reason, a deflection voltage equivalent to (X6–X5) is applied to the X deflection signal 47 at time $t_5$. The electron beam scan of arrow 49a starting from this state is performed by the X deflection signal 47 rising by the signal amplitude corresponding to the X direction size of the area 43 (X7–X6). Then the signal pattern falls by the signal amplitude corresponding to a returning deflection. Thereafter, the rise and fall are repeated continuously so that the scanning lines of arrows 49a through 49d are scanned with the electron beam.

The Y deflection signal 48, as in the embodiment 1, takes on a stepped waveform signal pattern having an increment component in the positive Y direction synchronous with the rise of the X deflection signal 47 and a horizontal component synchronous with the beam deflection signal in the positive X direction. Although the rises of the X deflection signal 47 are not strictly synchronous with those of the increment component of the Y deflection signal 48, they may be considered approximately synchronous if fine time controls are ignored.

The scanning start position X5 and scanning end position X8 for the control of beam deflection explained above are determined so that $(X8-X5)/(X7-X6) = \alpha$ and that $(X8-X7) = (X6-X5)$, as in the case of the inspection area 42.

The inspection area 44 is scanned in the same manner as the inspection area 42 of which the direction of electron-beam scanning is the same. The inspection area 45 is scanned in the same manner as the inspection area 43 of which the direction of electron-beam scanning is the same. However, because the inspection area 44 is different from the inspection area 43 and the inspection area 45 is different from the inspection area 43 in terms of Y direction positions in the swath 41, the magnitude of the offset signal to be added to the Y deflection signal 48 needs to be changed in keeping with the Y direction positions of the inspection areas 44 and 45.

When the above-described control of beam deflection is performed, the position information such as the positions X2, X3, X6 and X7 is quantities to be determined by the wafer subject to inspection, and the velocity coefficient $\alpha$ of stage movement is a quantity to be determined depending on how fast inspection is to be carried out. Thus, when the beam-deflection control explained above is incorporated into the actual device, the operator of the device inputs information corresponding to the positions X2, X3, X6, X7 and a (or information for calculating these quantities) through the setting screen of the control PC 14. On the basis of the input information, the control PC 14 calculates control information such as positions X1, X4, X5 and X8. Given the control information on the positions X1, X4, X5 and X8 calculated by the control PC14, the beam scanning controller 11 and stage controller 12 control the voltages and timings of the X and Y deflection signals as well as the stage velocity.

The embodiment 2 discussed above thus provides a circuit-pattern inspection device capable of performing inspection at a significantly higher velocity than before while maintaining the advantage of the embodiment 1 of inspecting desired areas over the wafer.

Embodiment 3

In embodiment 3, a typical configuration of a circuit-pattern inspection device is explained which can rapidly inspect only the peripheral circuits of memory mats using the beam-deflection control discussed in the embodiment 1 or embodiment 2. As in the embodiment 2, the hardware configuration of the device in the embodiment 3 is substantially the same as that in the embodiment 2, so that FIG. 1 will be cited as needed in the ensuing explanation.

Figure 5A:
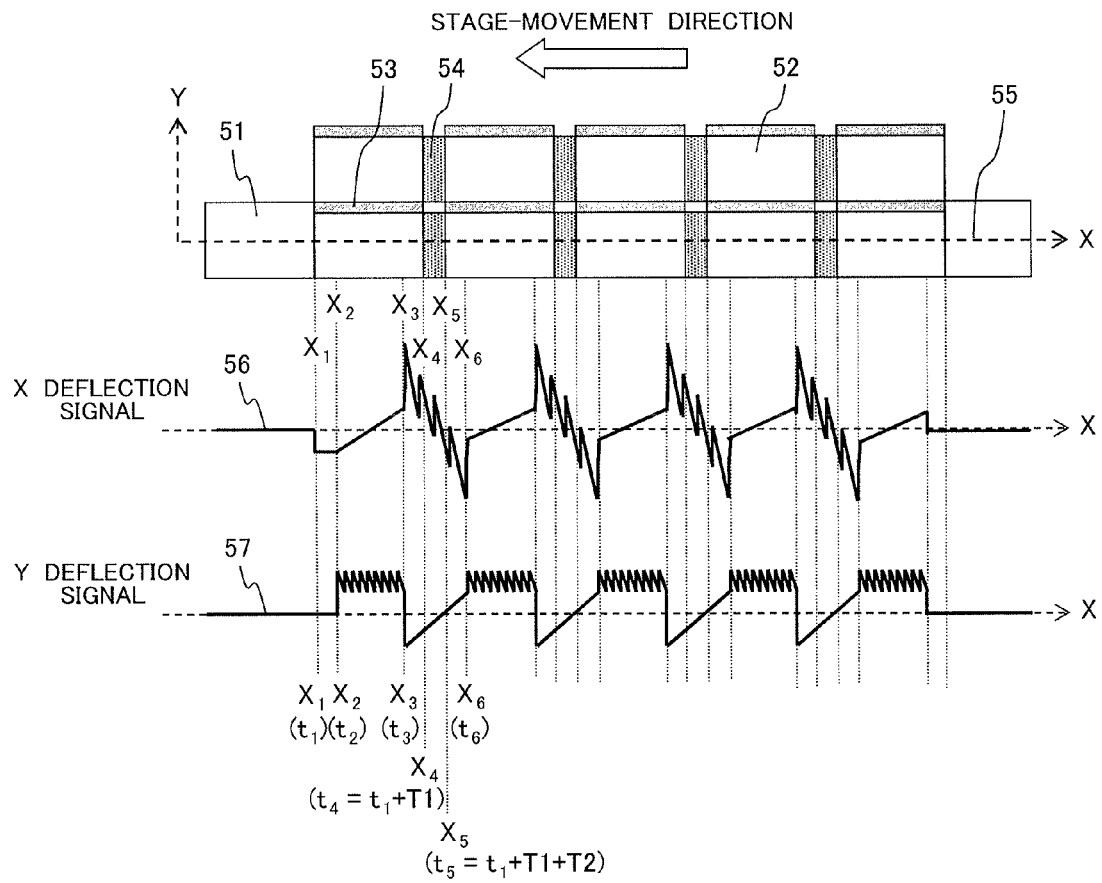
FIG. 5A is a schematic view showing inspection areas, an X deflection signal, and a Y deflection signal in a circuit-pattern inspection device in the embodiment 3.

FIG. 5A shows memory mats of the wafer and areas of their peripheral circuits, along with an X deflection signal and a Y deflection signal for scanning with the electron beam. A chip formed on the wafer has areas in which memory cells called memory mats are arrayed regularly. The memory mats are further surrounded by areas called peripheral circuits.

The upper part of FIG. 5A schematically shows a swath set to include a memory mat 52, a peripheral circuit area 53 above and below (Y direction) the memory mat 52, and a peripheral circuit area 54 to the right and left (X direction) of the memory mat 52. It is assumed that the width of the swath (i.e., the length of the swath in the direction intersecting the direction of stage movement) is set beforehand to match the memory mat width by the operator through the setting screen explained in the embodiment 1. It is further assumed that the direction of stage movement is in the negative X direction, the same as in the embodiments 1 and 2, and that the beam scanning velocity (pixel sampling frequency) is kept unchanged during stage movement.

With the inspection device operating on the conventional continuous-stage-movement-type, it is difficult to change the direction of electron-beam scanning during continuous movement of the stage. Thus upon inspection of the peripheral circuit areas 53 and 54 shown in the upper part of FIG. 5A, there is no choice but to obtain images of both areas using the electron beam applied for scanning linearly in the same Y direction.

When the scanning direction is the same, the time required for the electron beam to make a round trip over the peripheral circuit area 54 is longer than over the peripheral circuit area 53, because the peripheral circuit area 54 has a greater length than the peripheral circuit area 53 in the direction perpendicular (Y direction) to stage movement. As explained earlier in the comparative example, when the stage is to be moved at normal velocity, the stage velocity is set so that the stage will move by the size of one pixel while the electron beam makes a round trip of a single scanning line. That means the stage velocity that can be set for inspecting the peripheral circuit area 54 is lower than the stage velocity that may be set for inspecting the peripheral circuit area 53. Thus if the scanning start position and scanning end position of each area are to be aligned with the right and left edges of the area in question, it is necessary to match the stage velocity with the advancing velocity of electron-beam scanning by keeping the stage velocity to whichever is the lower velocity, with a wait time inserted during electron-beam scanning of the peripheral circuit area 53. However, this method is not preferable because the velocity of inspection drops by the amount of the wait time.

In this embodiment, the scanning direction is changed in keeping with the geometry (orientation in the longitudinal direction) of the peripheral circuit areas 53 and 54 (i.e., the scanning direction is changed to the direction intersecting the longitudinal direction), and the deflection signal waveforms are controlled to match each peripheral circuit area. These arrangements bring about an inspection device capable of performing inspection with no wait time, without changing the stage velocity or the beam scanning velocity halfway through inspection.

Specifically, the scanning direction is assumed to be the Y direction for the peripheral circuit area 53 of which the longitudinal direction is the direction of stage movement, and the scanning direction is assumed to be the X direction for the peripheral circuit area 54 of which the longitudinal direction intersects the direction of stage movement. Based on these assumptions, the stage velocity is obtained as (X5−X1)/(T1+T2), where T1 and T2 are the time required to scan each of the peripheral circuit areas 53 and 54 with the electron beam. The scanning of the peripheral circuit areas 53 and 54 with the electron beam is terminated according to the time for the electron beam reference position to move by the distance equal to the sum of the peripheral circuit areas 53 and 54.

When the scanning directions and stage velocities are set as explained above, the stage velocity for the peripheral circuit area 53 is lower than the electron-beam scanning velocity, and the stage velocity for the peripheral circuit area 54 is higher than the electron-beam scanning velocity. Consequently, the same situation as that of the embodiment 2 occurs for the peripheral circuit area 54, and a situation opposite to that of the embodiment 2 occurs for the peripheral circuit area 53. Thus for inspection of the peripheral circuit area 54, beam-deflection control is performed in such a manner that the start time of beam deflection is to be earlier and the end time thereof to be later, as in the case of the embodiment 2. Conversely, for inspection of the peripheral circuit area 53, beam-deflection control is carried out so that the start time of beam deflection is to be later and the end time thereof to be earlier.

Figure 5B:
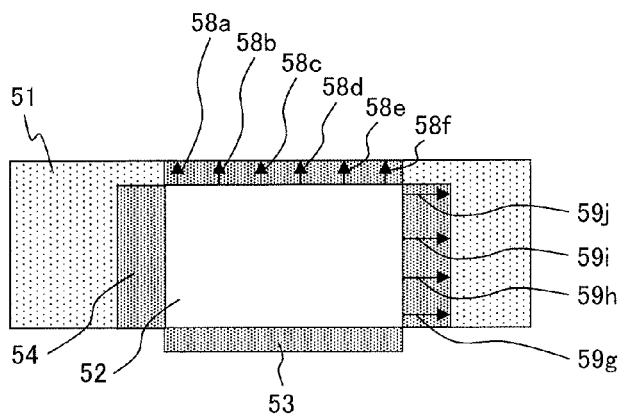
FIG. 5B is a schematic view showing a way of an electron-beam scanning in an inspection area in the circuit-pattern inspection device in the embodiment 3.

With reference to FIG. 5A and FIG. 5B, the control of beam deflection in electron-beam scanning over the peripheral circuit areas 53 and 54 is explained. FIG. 5B shows how electron-beam scanning is performed over the peripheral circuit areas 53 and 54 of the memory mat 52 in the swath 51.

First, the electron-beam scanning over the peripheral circuit area 53 is explained. Starting from the scanning start position X2, the peripheral circuit area 53 is scanned with the electron beam indicated by arrows 58a, 58b, 58c, 58d, 58e and 58f in this order.

At the time of the scan indicated by arrow 58a, the inspection device starts beam deflection at a point in time where the electron beam reference position reaches the position X2 (time $t_2$). In this case, the electron beam reference position is shifted to the right, by (X2−X1), of the left edge (position X1) of the peripheral circuit area 53 that should originally be irradiated with the electron beam. Thus the X deflection signal 56 corresponding to arrow 58a is supplemented with an offset signal having the amount of deflection corresponding to the distance of (X2−X1) in the negative direction. Because the scanning velocity of the electron beam is higher than the stage velocity over the peripheral circuit area 53, the offset by the X deflection signal 56 in the negative direction gradually decreases and is reduced to zero when scanning reaches the center of the peripheral circuit area 53. From that point on, the offset in the positive direction gradually increases. At the scanning end position X3, a positive deflection amount corresponding to the distance of (X4−X3) is added as an offset to the X deflection signal 56. Because the peripheral circuit area 53 is located at the upper edge (in the positive Y direction) of the swath 51, the Y deflection signal 57 turns out to be a signal obtained by adding the offset corresponding the scanning position in the positive Y direction to the sawtooth waveform signal for Y direction scanning. Thereafter, the same control of beam deflection along arrow 58a is also performed along arrows 58b, 58c, 58d, 58e and 58f for scanning of the rest of the peripheral circuit area 53.

Next, the electron-beam scanning over the peripheral circuit area 54 is explained. Upon completion of the scanning over the peripheral circuit area 53, the peripheral circuit area 54 is scanned starting from the scanning start position X3 with the electron beam indicated by arrows 59g, 59h, 59i and 59j in this order.

At the time of the scan with the electron beam indicated by arrow 59g, the electron beam reference position is located to the left (in negative X direction), by (X4−X3), of the left edge (X4) of the peripheral circuit area 54. For this reason, the X deflection signal 56 corresponding to arrow 59g is started from the offset amount in the positive direction corresponding to (X4−X3) and has a signal amplitude corresponding to the size of (X5−X4) in the X direction of the peripheral circuit area 54.

The scans with the electron beam indicated by arrows 59h and 59i are each started from the negative side of the X deflection signal 56 relative to the preceding scanning line, by the amount of stage movement from the scanning start time of arrow 59g or 59h that is the preceding scanning line.

At the time of the scan with the electron beam indicated by arrow 59j, the electron beam reference position is located to the right (in positive X direction), by (X6−X5), of the right edge (X5) of the peripheral circuit area 54. For this reason, the scan with the electron beam indicated by arrow 59j is performed with a scanning signal which starts from the negative offset amount corresponding to (X6−X4) and which ends with the negative deflection amount corresponding to (X6−X5).

Also, the Y deflection signal 57 is supplemented with an offset signal that corresponds to the electron-beam scanning positions in the Y direction indicated by arrows 59g, 59h, 59i and 59j. Although the signal waveform of the Y deflection signal 57 is the same stepped waveform as that of the embodiments 1 and 2, the signal is shown as a straight line in FIG. 5A because of the difficulty of drawing the exact waveform.

When the beam-deflection control explained above is incorporated into the actual device, the operator of the device inputs information including the inspection areas, the beam scanning direction of each inspection area, pixel size, and pixel sampling frequency through the setting screen of the control PC 14. The control PC 14 calculates the time (T1, T2) required to perform beam scanning of each area. Also, the control PC 14 determines the scanning start position X2 and scanning end position X3 of the peripheral circuit area 53 in a manner satisfying the equations $\{(X3-X2)/T1\}=\{(X6-X3)/T2\}$ and $(X4-X3)=(X6-X5)$. Given that $(X6-X5)=(X2-X1)$ derived from the repeat characteristic of the inspection areas, the control PC 14 determines the scanning end position X6 of the peripheral circuit area 54. The control PC 14 may also determine the scanning direction of each area on the basis of the longitudinal direction identified of each inspection area pattern derived from a previously obtained image (or design information) of each inspection area. The beam scanning controller 11 and stage controller 12 control the voltages and timings of the X and Y deflection signals as well as the stage velocity based on such control information as the scanning directions and positions X1, X4, X5 and X8 calculated by the control PC 14.

According to the embodiment 3 discussed above, it is possible to implement an inspection device capable of performing inspection with no wait time, without having to change the stage velocity during inspection or to change the beam scanning velocity, i.e., to make control operation changes leading to a drop in throughput. Although the embodiment 3 above is shown to have the electron beam applied for scanning in the X and Y directions, these two directions do not limit the scanning directions. Alternatively, scanning may be carried out at 45 degrees relative to the X direction.

Embodiment 4

In embodiment 4, a typical configuration of an inspection device is explained which inspects neighborhoods of the mat circumferences in memory mats as an exemplified variation of the inspection device explained in the embodiment 3. As in the embodiments discussed above, the hardware configuration of the device in this embodiment is substantially the same as that in the embodiment 1, so that FIG. 1 will be cited as needed in the ensuing description. Also, the basic preconditions for the embodiment 4 are the same as those for the above-described embodiments and thus will not be discussed further.

Figure 6A:
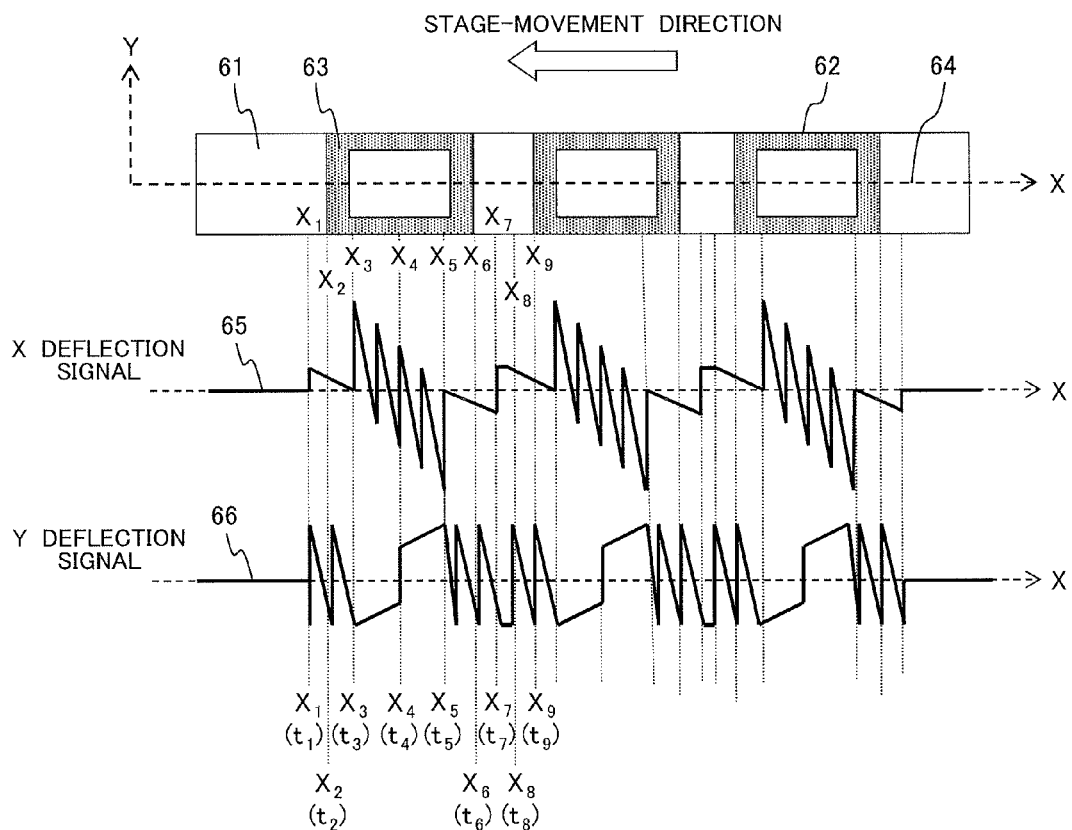
FIG. 6A is a schematic view showing inspection areas, an X deflection signal, and a Y deflection signal in a circuit-pattern inspection device in the embodiment 4.

FIG. 6A shows mat circumference neighborhoods in memory mats on the wafer, along with an X deflection signal and a Y deflection signal for scanning with the electron beam. The wafer has memory mats 62, each of which includes a mat circumference neighborhood 63 that constitutes an inspection area. The swath 61 includes an array of memory mats 62 containing the mat circumference neighborhoods 63.

In the embodiment 4, the stage velocity is determined by the following method:

First, in FIG. 6A, the scanning start position and scanning end position for electron-beam scanning over the inspection area (mat circumference neighborhood 63) are determined in such a manner that the equation $(X7-X6)=(X9-X8)=\{(X9-X6)-\beta\}/2$ is satisfied. The position X6 is at the right edge (in positive X direction) of the mat circumference neighborhood 63, and (X9−X6) represents the interval between memory mats 62. The positions X7 and X8 are determined on the basis of the memory mat interval (X9−X6) and the width of each memory mat 62 in the X direction (X6−X2). Reference character β denotes the distance to get a preparation time between the end of scanning over a given inspection area (mat circumference neighborhood 63) and the start of scanning over the next inspection area (mat circumference neighborhood 63). This distance is sufficiently small compared with the memory mat interval (X9−X6).

Next, the time T required to scan the entire inspection area (mat circumference neighborhood 63) is calculated from the size and electron-beam scanning conditions of the inspection area. The stage velocity is then obtained using a calculating formula (X6−X1)/T. It should be noted that (X9−X8)=(X2−X1) holds because of the pattern repeat characteristic.

Figure 6B:
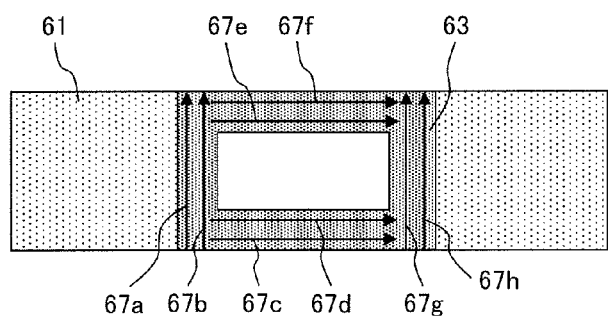
FIG. 6B is a schematic view showing a way of an electron-beam scanning in an inspection area in the circuit-pattern inspection device in the embodiment 4.

FIG. 6B shows how the mat circumference neighborhood 63 of a memory mat 62 is scanned with the electron beam. Electron-beam scanning over the mat circumference neighborhood 63 is explained below using FIG. 6B.

The inspection area (mat circumference neighborhood 63) is scanned with the electron beam indicated by arrows 67a, 67b, 67c, 67d, 67e, 67f, 67g and 67h in this order. In this case, the area being scanned with the beam in parallel to the mat boundary, the number of beam scans over the entire inspection area is smaller than that when the area is scanned perpendicularly to the mat boundary. This scanning can shorten the inspection time T by reducing the total beam returning time.

Arrows 67a and 67b indicate scans over the left-side circumference portion (negative X direction side) of the memory mat 62. The X deflection signal 65 is output as an offset signal for correcting the difference between the electron beam reference position and the scanning target position at each electron beam scan. The Y deflection signal 66 is output as a scanning signal in the Y direction.

Arrows 67c and 67d indicate scans over the lower side circumference portion (negative Y direction side) of the memory mat 62. The X deflection signal 65 is output as an X-direction scanning signal supplemented with an offset signal for correcting the difference between the electron beam reference position and the scanning target position at each electron beam scan. The Y direction signal 66 is output as an offset signal corresponding to the scanning position in the Y direction.

Arrows 67e and 67f indicate scans over the upper side circumference portion (positive Y direction side) of the memory mat 62. The X deflection signal 65 is output as an X-direction scanning signal supplemented with an offset signal. The Y deflection signal 66 is output as an offset signal corresponding to the scanning position in the Y direction.

Arrows 67g and 67h indicate scans over the right side circumference portion (positive X direction side) of the memory 62. The X deflection signal 65 is output as an offset signal for correcting the difference between the electron beam reference position and the scanning target position at each electron beam scan. The Y deflection signal 66 is output as a scanning signal in the Y direction.

According to the embodiment 4 discussed above, it is possible to implement an inspection device capable of further boosting the velocity of inspection by shortening the time required for beam returning, in addition to offering the advantage of the embodiment 3 whereby inspection with no wait time is made possible without the need for changing the stage velocity or beam scanning velocity during inspection or for making such control operation changes leading to a drop in throughput. Although the embodiment 4 above is shown to have the electron beam applied for scanning in the X and Y directions, these two directions do not limit the scanning directions as in the case of the embodiment 3.

Embodiment 5

In embodiment 5, a typical configuration of an inspection device is explained which can integrate image frames of an inspection area set within the swath. Frame integration designates obtaining plural images of the inspection area and integrating the obtained images. The integration boosts the S/N ratio of the image signal, so that a high-definition image is obtained and the accuracy of defect detection is improved. Because plural images are needed of the same inspection area, it is necessary to scan the same area as many times as the integration count established. What follows is an explanation of the embodiment 5 in the form of an inspection device which operates on the continuous-stage-movement-type and which satisfies the above-mentioned restrictions without changing the stage velocity or the beam deflection frequency during inspection. For purpose of simplification, it is assumed that the frame integration count is set to be two and the stage velocity to be the normal velocity. However, these settings do not limit the frame integration and stage velocity. Alternatively, the frame integration count may be three or more and the stage velocity may be asynchronous. Also, as in the embodiments discussed above, FIG. 1 will be cited as needed in explaining the embodiment 5 below, and repetitive explanations will be omitted.

This embodiment is under the constraint that each inspection area needs to be scanned as many times as the frame integration count without making changes in the stage velocity or in the beam deflection frequency. The basic idea of satisfying the constraint on this embodiment is similar to that on the embodiment 2. The beam deflection start time is set to be earlier and the beam deflection end time to be later than usual in keeping with the beam scanning velocity. What follows is an explanation of beam-deflection control with the embodiment 5 in reference to FIG. 7.

Figure 7:
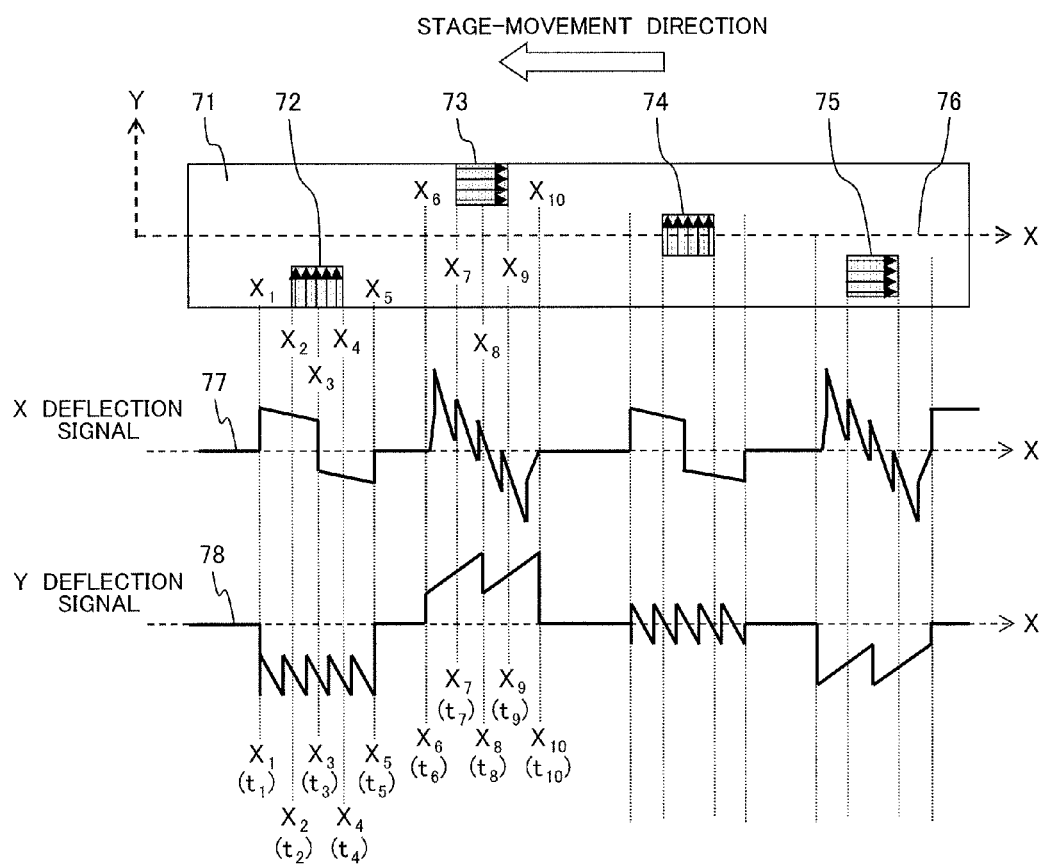
FIG. 7 is a schematic view showing inspection areas, an X deflection signal, and a Y deflection signal in a circuit-pattern inspection device in the embodiment 5.

FIG. 7 shows inspection areas of the wafer along with an X deflection signal and a Y deflection signal for scanning with the electron beam. A swath 71 is set to include plural inspection areas 72, 73, 74 and 75. The inspection areas 72, 73, 74 and 75 are scanned with the electron beam in the directions indicated by arrows.

First, the control of beam deflection over the inspection area 72 is explained. At a beam deflection start time $t_1$, the electron beam reference position is at the position X1 shifted to the left (in negative X direction), by (X2−X1), of the position X2 that should be originally scanned. For this reason, the X deflection signal 77 is supplemented with a positive-direction signal for correcting a displacement of (X2−X1). Thereafter, the X deflection signal 77 is supplemented with a continuous signal for correcting the difference between the electron beam reference position and the scanning target position in the inspection area 72. Simultaneously, scanning in the Y direction is carried out by the Y deflection signal 78 having a sawtooth waveform. In the manner described above, the inspection area 72 is scanned continuously. It should be noted that because the inspection area 72 is set at the lower edge (edge in the negative Y direction) of the swath 71, the Y deflection signal 78 turns out to be a continuous scanning signal supplemented with an offset in the negative direction.

At time $t_3$, the electron beam reference position reaches the position X3 that is the middle point of the inspection area 72 in the X direction. This completes the first scan over the inspection area 72.

Then in order to perform a second electron beam scan over the inspection area 72 again starting from its left edge, the X deflection signal 77 is shifted to the negative side by as much as the width (X4−X2) of the area 72 in the direction of stage movement. Thereafter, continuous scanning is resumed by having the X deflection signal 77 supplemented with a signal for correcting the difference between the electron beam reference position and the scanning target position in the inspection area 72. At the position X5, the right edge of the inspection area 72 (edge in the positive X direction) is scanned, which completes the second scan over the area 72.

The procedure for scanning the inspection area 73 is explained next. The scanning start position X6 is located to the left (in negative X direction), by (X7−X6), of the left edge (X7) of the inspection area 73. For this reason, the X deflection signal 77 is a deflection signal which is started in the positive direction by a deflection amount corresponding to (X7−X6) and which has a signal amplitude corresponding to the X-direction size of the area 73 (X9−X7). At this point, the Y deflection signal 78 is impressed with a positive signal so as to scan the lower edge (negative Y direction edge) of the inspection area 73 on the upper side (positive Y direction side) of the swath 71.

Thereafter, the scanning start position of the X deflection signal 77 is shifted to the negative side in keeping with the amount of stage movement. At the same time, the inspection area 73 is scanned by having the Y deflection signal 78 impressed with an increasing positive signal. At the position X8 that is the middle point of the inspection area 73 in the X direction, the upper edge (positive Y direction edge) of the inspection area 73 is scanned, which completes the first scan over the inspection area 73.

In order to proceed with a second electron beam scan over the inspection area 73 again starting from its lower edge, the Y deflection signal 78 is shifted to the negative side by as much as the width of the inspection area 73 in the Y direction, before scanning is performed with the X deflection signal 77. Thereafter, the scanning start position of the X deflection signal 77 is again shifted to the negative side in keeping with the amount of stage movement. At the same time, the inspection area 73 is scanned by having the Y deflection signal 78 impressed with an increasing positive signal. At the position X10, the second scan over the inspection area 73 is completed.

The inspection areas 74 and 75 may be scanned in the same manner as the inspection areas 72 and 73. It should be noted, however, that the magnitude of the offset signal added to the Y deflection signal 78 needs to be changed in keeping with the positions in the Y direction of the inspection areas 74 and 75 within the swath 71.

When the frame integration count is three or more, it is evident that the integration can be supported by enlarging the margins of the scanning start time (time $t_2-t_1$ or $t_7-t_6$) and of the scanning end time (time $t_5-t_4$ or $t_{10}-t_9$). That is, the electron beam reference position X1 or X6 at the start of beam deflection and the electron beam reference position X5 or X10 at the end of beam deflection are set farther from the edges of the inspection area than in the case of the frame integration count being two. The distance between the electron beam reference position at the start of beam deflection and the electron beam reference position at the end of beam deflection (i.e., distance between X1 and X5 or distance between X6 and X10) is equally divided by the frame integration count into positions that are set as the scanning end/start positions for each frame. Within each of the equally divided areas, beam-deflection control is carried out in the manner described above.

It is also evident that the stage velocity can be set to be higher than the normal velocity using the configuration of this embodiment. That is, as in the case of the embodiment 2, the margins for the beam deflection start and end positions are set in consideration of the ratio α of the stage velocity to the normal stage velocity with regard to each of the area portions divided equally by the frame integration count. This makes it possible to implement a circuit-pattern inspection device offering two advantages: higher-resolution imaging through frame integration, and rapid inspection at a higher velocity of stage movement than before.

When the beam-deflection control explained above is incorporated into the actual device, the operator of the device inputs inspection area position information (X2, X4, X7, and X9) and stage velocity information (velocity coefficient α or information for calculating α) through the setting screen of the control PC 14. Based on the input information, the control PC 14 calculates such control information as positions X1, X5, X6 and X10. On the basis of such control information about the positions X1, X5, X6 and X10 calculated by the control PC 14, the beam scanning controller 11 and stage controller 12 control the voltages and timings of the X and Y deflection signals as well as the stage velocity.

According to the embodiment 5 discussed above, it is possible to implement a highly reliable circuit-pattern inspection device capable of obtaining higher-resolution images through frame integration with less false detection information than before, in addition to offering the advantage of the embodiment 1 whereby efficient inspection is made possible because desired areas of the wafer can be inspected. Also, when images of the same area are obtained at predetermined intervals through frame integration, it is possible to carryout circuit pattern inspection with minimum effect of electrostatic charge.

Embodiment 6

In embodiment 6, a typical configuration of a circuit-pattern inspection device is explained which can perform pre-scan using a primary electron beam. "Pre-scan" designates a scanning with the electron beam before irradiation with the electron beam for image acquisition, for the purpose of either discharging the inspection area or forming a desired charge potential. In order to make the charged state uniform over areas including the inspection area circumference portion, the scanning area size for pre-scan execution is often set to be larger than the inspection area size. In the ensuing description of the embodiment 6, FIG. 1 will be cited as needed and repetitive explanations will be omitted. It is assumed that for purpose of simplification, the stage velocity is the normal velocity and remains unchanged.

Figure 8:
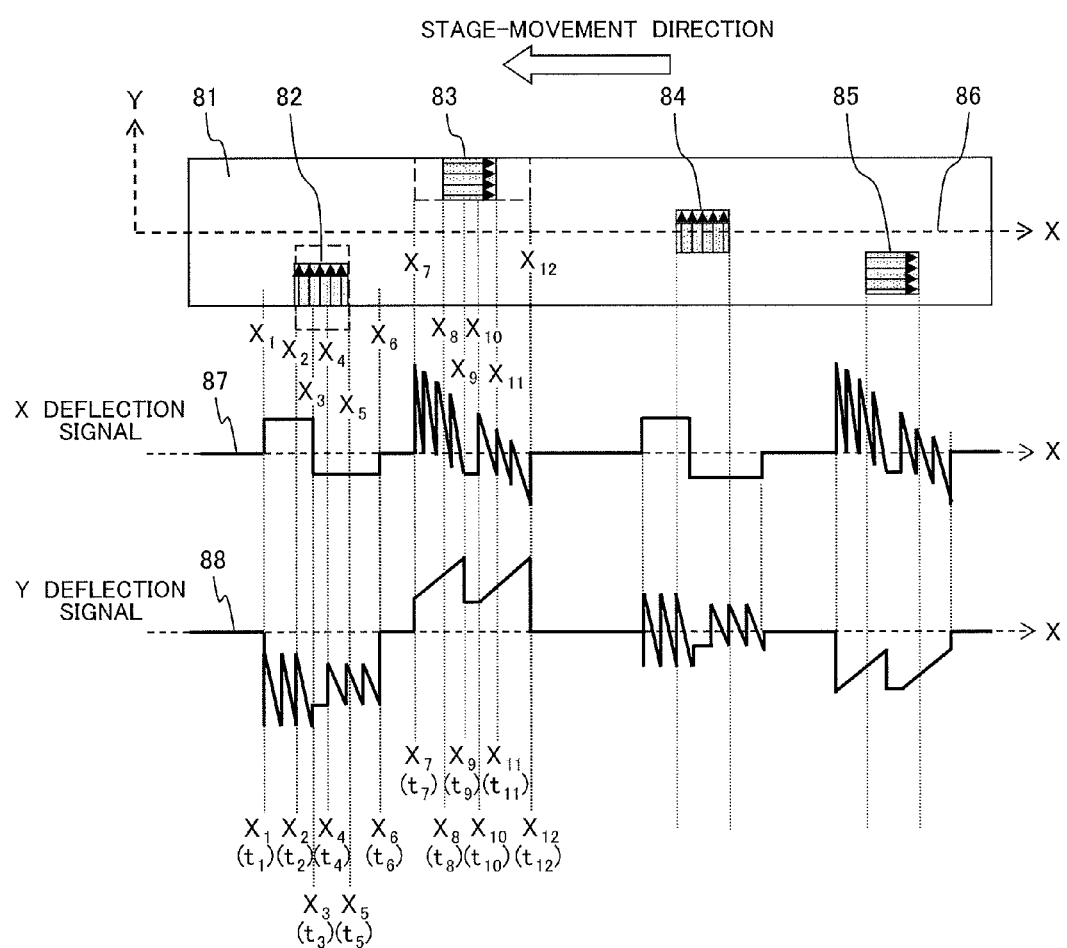
FIG. 8 is a schematic view showing inspection areas, an X deflection signal, and a Y deflection signal in a circuit-pattern inspection device in the embodiment 6.

FIG. 8 shows inspection areas over a wafer along with an X deflection signal 87 and a Y deflection signal 88 for scanning with the electron beam. A swath 81 is set to include plural inspection areas 82, 83, 84 and 85 laid out in a manner similar to what is shown in FIG. 3, 4 or 7.

Electron-beam scanning over the inspection area 82 is explained first. As shown in FIG. 8, the inspection area 82 is scanned in the Y direction. A pre-scan area indicated by broken lines is set around the inspection area 82. Although the pre-scan area is in fact set not only in the Y direction but also in the X direction, FIG. 8 shows the pre-scan area set only in the Y direction for purpose of simplification and illustration.

With this embodiment, each inspection area is scanned with the electron beam in a sequence of a pre-scan, suspension of scan during a predetermined wait time, and a main scan (i.e., electron-beam scanning for image acquisition) in this order. That is, the pre-scan and the suspension of scan are performed while the electron beam reference position is on the left side of the inspection area 82. The main scan is carried out while the electron beam reference position is on the right side of the inspection area 82. The size of the scanning area at the pre-scan is different from that of the scanning area at the main scan. Therefore, the embodiment 6 employs first X and Y deflection signals and second X and Y deflection signals having waveforms that are different between at the pre-scan and at the main scan in terms of amplitude, inclination, and rise timing.

The pre-scan over the inspection area 82 is started when the electron beam reference position is at the position X1 (time $t_1$) and is completed at the position X3 (time $t_3$). Thus the X deflection signal 87 is set with a positive deflection voltage corresponding to a displacement correction amount of (X2−X1) relative to the position X2 that should originally be scanned at time $t_1$. Whereas the electron beam reference position is at the position X3 at the end of the pre-scan, the scanning line that should originally be scanned with the electron beam is at the left edge (position X5) of the inspection area 82. The electron beam reference position is still located to the left of the original scanning line. Thus at the end of the pre-scan, the X deflection signal 87 is also set with a positive deflection voltage corresponding to a displacement correction amount of (X5−X3) between the position X5 and X3.

In the case of the embodiment 6, the stage velocity is synchronized with the beam deflection frequency at pre-scan.

That means the amount of displacement between the electron beam reference position and the original scanning line at time $t_3$ is the same as the displacement amount at time $t_1$. Thus the X deflection signal 87 takes a constant value from time $t_1$ until time $t_3$.

The Y deflection signal 88 in the form of a sawtooth waveform deflection signal is applied to the deflector 6 during the pre-scan. The amplitude of the pre-scan is set to be sufficiently larger (e.g., twice) than the size of the inspection area 82. Thus the signal amplitude of the sawtooth waveform is twice the signal amplitude of the sawtooth waveform at main scan in keeping with the scanning width of the pre-scan area.

Upon completion of the pre-scan at time $t_3$, the electron beam reference position is at the position X3 and the applied position of the electron beam is at the bottom right edge of the area 82. A wait-time sequence is started at time $t_3$ and, with electron blanking brought into effect, the X deflection signal 87 is shifted in the negative direction by (X4−X2) and the applied position of the electron beam is returned to the left edge of the inspection area 82. The blanking is performed for fear of changes in the wafer charge condition that may be incurred by the beam being applied to a fixed location on the wafer.

Electron blanking is disabled at time $t_4$, and electron-beam scanning for image acquisition is started from there. As mentioned above, the electron beam reference position is at the position X4 at time $t_4$, shifted by (X4−X2) to the right (in positive X direction) from the original scanning line position X2. However, because of its preceding shift in the negative direction at time $t_3$, the electron beam reference position is currently at X2. Thereafter, scanning is performed in the Y direction by having the X deflection signal 87 supplemented with a signal for correcting the difference between the electron beam reference position and the scanning target position in the inspection area 82, whereby the inspection area 82 is scanned continuously. From time $t_4$ until time $t_6$, the X deflection signal 87 takes a constant value because the stage velocity is synchronous with the beam scanning velocity in the X direction. Meanwhile, the signal waveform of the Y deflection signal 88 is the ordinary sawtooth waveform.

At the position X6 (time $t_6$), the right edge of the inspection area 82 (positive X direction edge) is scanned. This completes the scanning of the inspection area 82 as a whole.

The procedure for scanning the inspection area 83 is explained next. As shown in FIG. 8, the inspection area 83 is scanned in the X direction, and a pre-scan area indicated by broken lines is set around the inspection area 83. FIG. 8 shows the pres-scan area set only in the X direction for purpose of simplification and illustration as in the case of the inspection area 82.

The pre-scan of the inspection area 83 is started at time $t_7$ and completed at position X9 (time $t_9$). The waveform of the X deflection signal at time $t_7$ has an amplitude corresponding to a displacement correction amount of (X8−X7) between the positions X7 and X8. Thereafter continues a sawtooth waveform signal pattern having the amplitude corresponding to the length of the pre-scan area until time $t_9$.

Upon completion of the pre-scan at the position X9, electron-beam scanning for image acquisition is started at the position X10 from the lower side (in negative Y direction) of the inspection area 83. Because the position X10 is shifted by (X10−X8) to the right (in positive X direction) from the left edge (X8) of the inspection area 83, the X deflection signal 87 is a deflection signal which starts from the position shifted in the negative direction by the displacement amount corresponding to (X10−X8). The X deflection signal 87 has an amplitude corresponding to the X-direction size of the inspection area 83 (X11−X8). At this point, the Y deflection signal 88 is supplemented with a positive signal so that the lower edge (negative Y direction edge) of the inspection area 83 located on the upper side (positive Y direction side) of the swath 81 is scanned.

Thereafter, the scanning start position of the X deflection signal 87 is shifted to the negative side in keeping with the amount of stage movement. At the same time, the inspection area 83 is scanned by having the Y deflection signal 88 supplemented with an increasing positive signal. At the position X11, the upper edge (positive Y direction edge) of the inspection area 83 is scanned, which completes the scanning of the inspection area 83 as a whole.

The inspection areas 84 and 85 are scanned in the same manner as the inspection areas 82 and 83 respectively. However, it is necessary to change the magnitude of the offset signal added to the Y deflection signal 88 in keeping with the positions in the Y direction of the inspection areas 84 and 85 in the swath 81.

When the beam-deflection control explained above is incorporated into the actual device, the operator of the device inputs inspection area position information (X2, X5, X8, and X11) and pre-scan area information through the setting screen of the control PC 14. Based on the input information, the control PC 14 calculates such control information as positions X1, X5, X6 and X10. On the basis of such control information about the positions X1, X5, X6 and X10 calculated by the control PC 14, the beam scanning controller 11 and stage controller 12 control the voltages and timings of the X and Y deflection signals as well as the stage velocity. The configuration of this embodiment may further be combined with arrangements for enhancing the stage velocity. In this case, the velocity information for stage movement (velocity coefficient α or information for calculating α) set by the device operator may be used to calculate the control information regarding the positions X1, X5, X6 and X10.

According to the above-described embodiment 6 that uses the X and Y deflection signals having different waveforms at pre-scan and at main scan, it is possible to provide the advantageous capability of inspecting contact-hole bottoms, wiring patterns of high-resistance materials and other specimens which are charged during pre-scan and on which a good potential contrast is therefore difficult to obtain during normal scan, the advantage being offered in addition to the advantage of the embodiment 1 whereby efficient inspection is made possible because desired areas of the wafer can be inspected. Also, setting of the wait time after the pre-scan provides an advantageous effect of enabling an observation of relaxation of the charged state caused by the pre-scan.

Embodiment 7

Figure 9A:
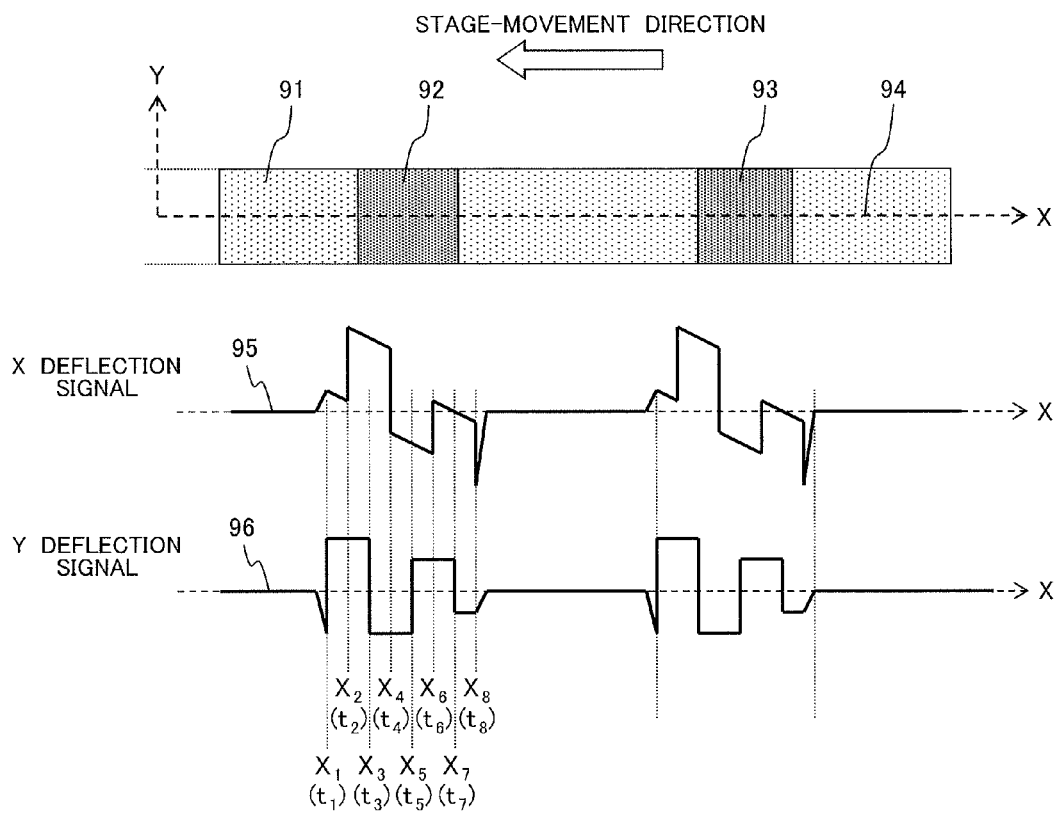
FIG. 9A is a schematic view showing inspection areas, an X deflection signal, and a Y deflection signal in a circuit-pattern inspection device in the embodiment 7.
Figure 9B:
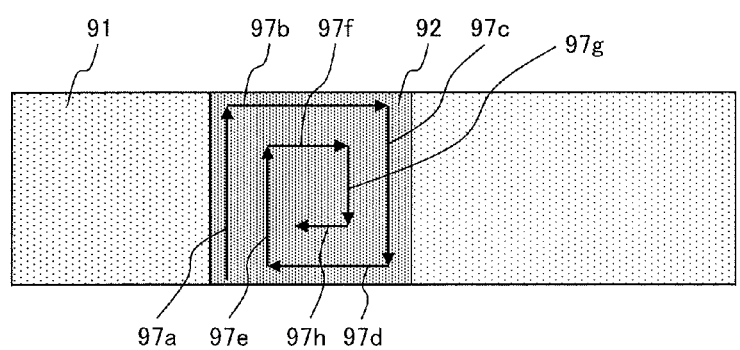
FIG. 9B is a schematic view showing a way of an electron-beam scanning in an inspection area in the circuit-pattern inspection device in the embodiment 7.

With reference to FIGS. 9A and 9B, embodiment 7 of the circuit-pattern inspection device is explained below. The embodiment 7 concerns the control of beam deflection for performing so-called helical scan. The embodiment aims at implementing an electron-beam scanning method in which the scanning direction of the electron beam is continuously changed for each scan and the scanning length of each scan is continuously shortened.

With reference to FIGS. 9A and 9B, the method is explained for electron-beam scanning over inspection areas 92 and 93 with an X deflection signal 95 and a Y deflection signal 96. Although FIG. 9 shows only two scanning lines in the same direction for purpose of simplification and illustration, there actually exist numerous scanning lines. The X deflection signal 95 is designated as positive when the electron beam deflects in the positive X direction (rightward in FIG. 9A); the Y deflection signal 96 is designated as positive when the electron beam deflects in the positive Y direction (upward in FIG. 9A).

FIG. 9B shows how the inspection area 92 in the swath 91 is scanned with the electron beam. Electron-beam scanning over the inspection area 92 is explained below using FIG. 9B.

The inspection area 92 is scanned with the electron beam indicated by arrows 97a, 97b, 97c, 97d, 97e, 97f, 97g and 97h in this order. The electron beam scan indicated by arrow 97b is started from the end point of the electron beam scan indicated by arrow 97a. The electron beam scan indicated by arrow 97c is started from the end point of the electron beam scan indicated by arrow 97b. In this manner, the endpoint of a given electron beam scan always becomes the start point of the next electron beam scan. Consequently, there is no need to return the electron beam to the start position of the next electron beam scan. For this reason, the time required to scan the inspection area 92 with the electron beam can be shortened by as much as the time required for the beam returning.

In FIG. 9B, the lengths (electron beam scan distances) and positions (electron beam scan positions) of arrows 97a, 97b, 97c, 97d, 97e, 97f, 97g and 97h are obtained by calculating the trajectories of the electron beam scans based on the size (width) of the inspection area 92 and on the pixel size of the image of the inspection area. In the ensuing description, the electron beam scan distances corresponding to arrows 97a, 97b, 97c, 97d, 97e, 97f, 97g and 97h will be represented by the lengths of the respective arrows 97a, 97b, 97c, 97d, 97e, 97f, 97g and 97h.

First, at the electron beam reference position X1, the deflection signal for the electron beam scan indicated by arrow 97a is applied. Because the electron beam scan indicated by arrow 91a is in the Y direction, the Y deflection signal 96 is impressed with a scanning signal corresponding to the length of arrow 97a. The X deflection signal 95 is impressed with a signal for correcting the difference between the electron beam reference position and the scanning target position.

Next, at the position X2, the deflection signal for the electron beam scan indicated by arrow 97b is applied. Because the electron beam scan indicated by arrow 97b is in the X direction, the X deflection signal 95 is impressed with a scanning signal whose amplitude corresponds to the length of arrow 97b minus the distance of stage movement during the scan time. Because the electron beam scan indicated by arrow 97b is on the upper side (in positive Y direction) of the swath 91, the Y deflection signal 96 is impressed with a positive offset signal corresponding to the scanning position.

Next, at the position X3, the deflection signal for the electron beam scan indicated by arrow 97c is applied. Because the electron beam scan indicated by arrow 91c is in the downward Y direction (negative Y direction), the Y deflection signal 96 is impressed with a scanning signal that changes from positive to negative. Also, the X deflection signal 95 is impressed with a signal for correcting the difference between the electron beam reference position and the scanning target position.

Further, at the position X4, the deflection signal for the electron beam scan indicated by arrow 97d is applied. Because the electron beam scan indicated by arrow 91d is in the leftward X direction (negative X direction), the X deflection signal 95 is impressed with a scanning signal that changes from positive to negative. The amplitude of this scanning signal amounts to the length of arrow 97d plus the distance of stage movement during the scan time. Because the electron beam scan indicated by arrow 97d is on the lower side (in negative Y direction) of the swath 91, the Y deflection signal 96 is impressed with a negative offset signal corresponding to the scanning position.

Thereafter, as explained above with regard to the positions X1, X2, X3 and X4, the X deflection signal 95 and Y deflection signal 96 are applied corresponding to the electron beam scans indicated by arrows 97e, 97f, 97g and 97h at the positions X5, X6, X7, and X8. This completes the scanning of the area 92 as a whole.

According to the embodiment 7 above, it is possible to implement an inspection device capable of eliminating the time for returning deflections and thereby shortening the time required to scan the inspection area with the electron beam.

Embodiment 8

Figure 10:
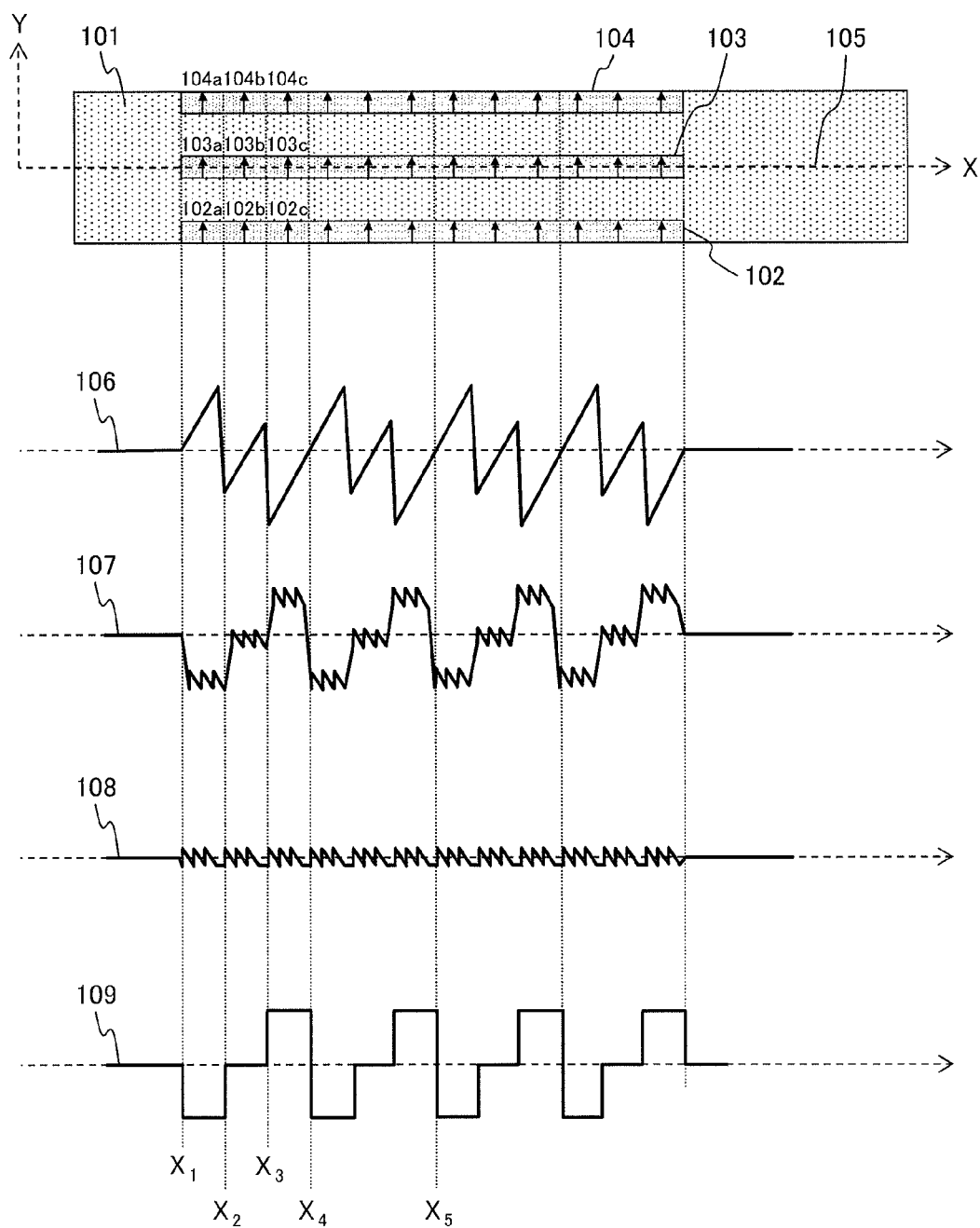
FIG. 10 is a schematic view showing inspection areas, an X deflection signal, a Y deflection signal, and a continuous scanning signal and an offset signal for composing the Y deflection signal in a circuit-pattern inspection device in the embodiment 8.

With reference to FIG. 10, embodiment 8 of the circuit-pattern inspection device is explained below. The embodiment 8 deals with plural areas divided in the direction of stage movement and in the vertical direction. In order to inspect plural divided inspection areas in the same swath, the composite signal of a continuous scanning signal and an offset signal is applied as a deflection signal in the vertical direction (Y direction) to the direction of stage movement.

FIG. 10 shows inspection areas of the wafer, an X deflection signal 106 and a Y deflection signal 107 for scanning with the electron beam, and a continuous scanning signal 108 and an offset signal 109 for generating the Y deflection signal 107. A swath 101 includes plural inspection areas 102, 103 and 104. The X deflection signal 106 is a signal that makes the electron beam scan in the X direction, and the Y deflection signal 107 is a signal that makes the electron beam scan in the Y direction. The Y deflection signal 107 is generated as the composite of the continuous scanning signal 108 and offset signal 109. The continuous scanning signal 108 and offset signal 109 are applied to two independent deflectors respectively, the deflectors acting together to make the electron beam scan with the Y deflection signal 107. The deflector to which the continuous scanning signal 108 is applied is characterized to have a smaller maximum deflection width but higher responsiveness than the deflector to which the offset signal 109 is applied. The stage is moved in the negative X direction so as to move the wafer in the negative X direction.

The swath 101 is carried out by a single stage movement. At this point, the electron beam reference position is shifted over the wafer from the negative X direction to the positive X direction (from left to right in FIG. 10) along a broken line 105 indicative of the center of the swath 101. Arrows 102a, 102b, 102c, 103a, 103b, 103c, 104a, 104b and 104c in the inspection areas 102, 103 and 104 indicate the directions of electron-beam scanning.

Hereinafter, the method is explained for electron-beam scanning over the inspection areas 102, 103 and 104 using the X deflection signal 106 and Y deflection signal 107. The X deflection signal 106 is designated as positive when the electron beam deflects in the positive X direction (rightward in FIG. 10); the Y deflection signal 107 is designated as positive when the electron beam deflects in the positive Y direction (upward in FIG. 10).

In FIG. 10, it is assumed that X2−X1=X3−X2=X4−X3. The scans indicated by arrows 102a, 102b and 102c are performed in this order with the electron beam when the electron beam reference position moves from X1 to X2; the scans indicated by arrows 103a, 103b and 103c are performed in this order with the electron beam when the electron beam reference position moves from X2 to X3; and the scans indicated by arrows 104a, 104b and 104c are performed in this order when the electron beam reference position moves from X3 to X4.

First, the method of electron-beam scanning over the inspection area 102 is explained. At the position X1, the electron beam reference position reaches the start point of the inspection area 102. At this point, electron-beam scanning is started in the Y direction. Here, the continuous scanning signal 108 is impressed with a continuous scanning signal having the amplitude corresponding to the width of the inspection area 102 (length in Y direction). Because the inspection area 102 is set on the lower side of the swath 101 (edge in negative Y direction) shown in FIG. 10, the offset signal 109 is impressed with a negative-direction signal. As a result, the Y deflection signal 107 becomes a scanning signal having an offset in the negative direction, which causes the electron beam scan of arrow 102 to be performed. Then the electron beam scan of arrow 102b is performed, with the electron beam reference position located on the left of the scanning target position at this point. For this reason, the X deflection signal 106 is impressed with a positive offset signal. At the scan of arrow 102c, the X deflection signal 106 is impressed with a positive offset signal of a greater magnitude because the difference between the electron beam reference position and the scanning target position becomes larger.

Next, the method of electron-beam scanning over the inspection area 103 is explained. When the electron beam reference position is at X2, scanning of the inspection area 103 is started. At the electron beam scan of arrow 103a, the X deflection signal 106 is impressed with a negative offset signal because the electron beam reference position is on the right of the scanning target position. Then at the electron beam scan of arrow 103b, the X deflection signal 106 is given a zero offset signal because the electron beam reference position coincides with the scanning target position. Further at the electron beam scan of arrow 103c, the X deflection signal 106 is impressed with a positive offset signal because the electron beam reference position is on the left of the scanning target position. Since the inspection area 103 is set at the center of the swath 101, the offset signal 109 becomes zero.

Next, the method of electron-beam scanning over the inspection area 104 is explained. When the electron beam reference position is at X3, scanning of the inspection area 104 is started. At the electron beam scan of arrow 104a, the X deflection signal 106 is impressed with a negative offset signal because the electron beam reference position is on the right of the scanning target position. As scanning over the inspection area 104 progresses, the difference between the electron beam reference position and the scanning target position gradually decreases. That difference disappears at the electron beam scan of arrow 104c. At this point, the X deflection signal 106 is impressed with a zero offset. Since the inspection area 104 is set on the upper side of the swath 101 (edge in positive Y direction) shown in FIG. 10, the offset signal 109 is impressed with a positive direction signal.

After the completion of the electron beam scan of arrow 104c, the portion covered by the electron beam reference position moving from X4 to X5 is inspected in the same manner.

The inspection operations of the embodiment 8 are carried out in such a manner that after the three scans have been completed over a given inspection area, the next inspection area is reached for scanning. Alternatively, more than three scans may be completed over a given inspection area before the next inspection area is reached. As another alternative, one or two scans may be completed over a given inspection area before the next inspection area is reached.

In this embodiment, an example is explained which applies the method of inspection with high-velocity stage movement explained in the embodiment 2 to the inspection of NAND type flash memories. The overall configuration of the device is the same as that shown in FIG. 1 and will not be discussed further because the configuration of FIG. 1 is already explained in the embodiment 1. In the ensuing description, FIG. 1 will be cited as needed.

Figure 11:
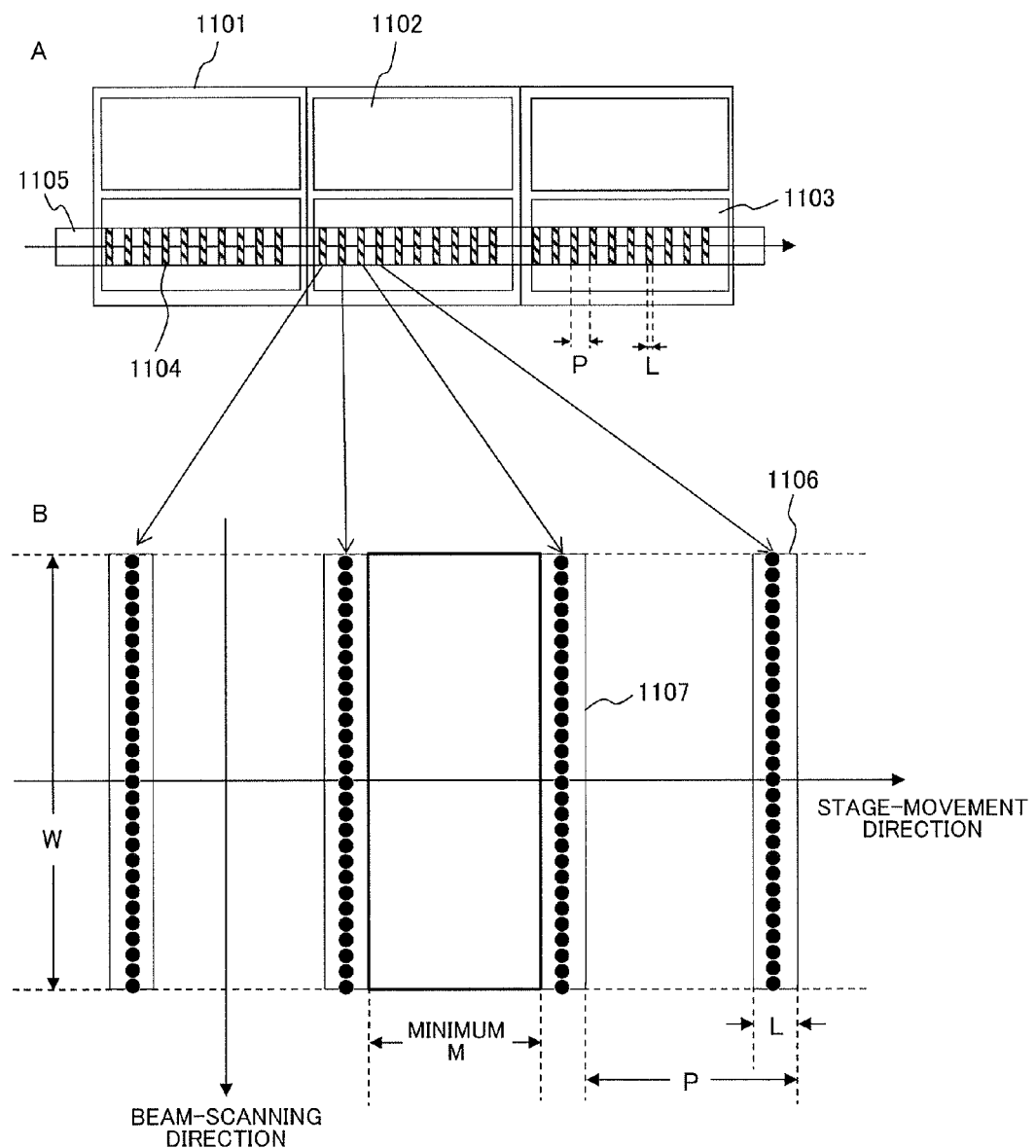
FIG. 11 is a schematic view showing relations between a die array and a swath in a flash memory.

As shown in FIG. 11, there are two or three memory areas formed in a die 1101 in the step of forming contact holes on the NAND type flash memory. Subfigure A in FIG. 11 shows a die in which memory areas 1102 and 1103 are formed. In each of the memory areas, contact-hole rows 1104 are formed at intervals of several microns. Upon inspection, swaths 1105 are established over plural dies, and images are obtained from inside the swaths.

When the conventional inspection method is used to inspect the NAND type flash memory shown in subfigure A in FIG. 11, a suitable number of swaths 1105 are set over the die 1101. The XY stage 2 is continuously moved unidirectionally at a velocity synchronized with the beam deflection frequency of the deflector 6 so that images of all areas in the swath 1105 may be obtained for inspection.

The step of forming contact holes on the NAND type flash memory is characterized as follows. The contact-hole rows 1104 are located intermittently in the memory areas. The interval between contact-hole rows 1104 is greater than the width of a contact-hole row 1104. Furthermore, there is no pattern between adjacent contact-hole rows. That means the attempt to obtain images of the spacing between the contact-hole rows is quite wasteful. Thus inspection for higher throughput than before can be implemented through application of the method of inspection with high-velocity stage movement explained in the embodiment 2.

Upon actual inspection, part of the contact-hole rows 1104 is displayed on the setting screen displayed by the screen display unit attached to the control PC 14 so that the area for inspection including the contact-hole rows (i.e., an image acquisition area 1106) may be set. This operation is carried out by the operator of the device, who can manipulate a pointer on the above-mentioned setting screen. In the ensuing description, the above-mentioned image acquisition area 1106 will be called the ROI (Region of Interest).

Once a desired ROI is determined, the control PC 14 automatically sets the width of the ROI (length in the direction of stage movement), the pitch between adjacent ROIs, swath width, etc., on the basis of size and position information about the target ROI. Also, based on the periodicity of the patterns targeted for inspection such as those of the contact-hole rows 1104, the position settings of the ROI are extended to another die or an area that includes contact-hole rows as another target for inspection so that the coordinates of the ROI in the other die or memory area may be automatically set. The arithmetic operations for carrying out the extension above are also performed by the control PC 14.

Next, the control of stage movement for high-velocity inspection is explained.

As shown in subfigure B in FIG. 11, it is assumed here that M denotes the size of the field of view (FOV) through which an image is obtained in the swath 1105. Generally, the size M of the FOV is at least tens of µm and the pattern pitch is about 5 to 10 µm. The size M is set in such a manner that the FOV accommodates at least the end edge line of a given ROI and the start edge of the next ROI to be scanned. It is assumed that L stands for the width of the ROI (length in the direction of stage movement), P for the pitch between the ROIs, and W for the swath width. It is also assumed that $\sigma$ represents the pixel size of an inspection image and that as many as N ($N=L/\sigma$) scanning line are set within the ROI.

Figure 12:
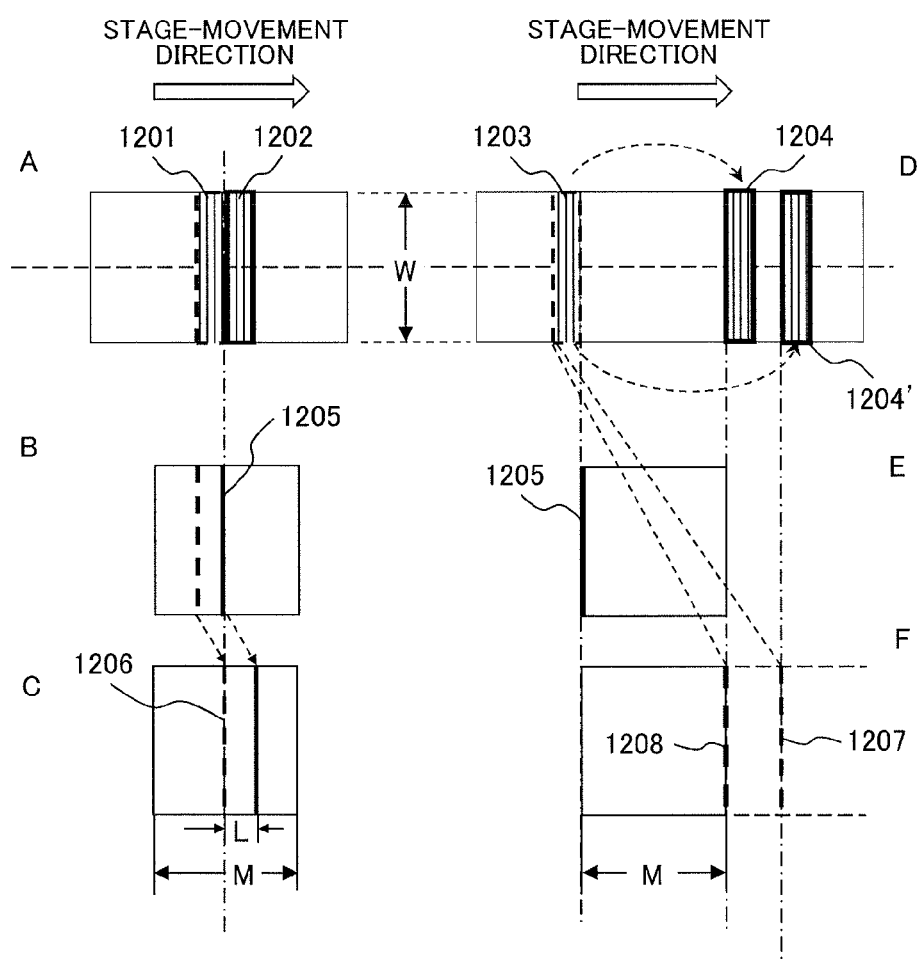
FIG. 12 is a schematic view showing a way of appearances of ROI area on a specimen and ROI area in a field of view M, comparing a case when the velocity of stage movement is synchronous and a case when the velocity of stage movement is asynchronous.

FIG. 12 shows changes in the position of primary charged particle beam when the velocity of stage movement is synchronous with beam deflection, compared with changes in the position of primary charged particle beam when the velocity of stage movement is asynchronous with beam deflection.

Subfigure A in FIG. 12 schematically shows the movement of the position of beam irradiation when the specimen is transported at a stage-movement velocity synchronous with beam deflection. An area 1201 indicated by broken lines denotes the position of the ROI at scanning start time of the first scanning line over the ROI, and an area 1202 indicated by solid lines represents the position of the ROI at scanning end time of an N-th scanning line. In this case, the primary charged particle beam is applied for scanning only in the Y direction along a dashed line in the illustration. A first scanning line 1205 and an N-th scanning line 1206 in the ROI are moved only as much as the length corresponding to the actual distance L over the wafer within the field of view M. This is because the velocity of stage movement is synchronous with the beam scanning velocity, as mentioned above.

Subfigure D in FIG. 12 schematically shows the movement of the applied position of the electron beam when the specimen is transported at a stage-movement velocity asynchronous with beam deflection. As in subfigure A, an area 1203 indicated by broken lines denotes the position of the ROI at scanning start time of the first scanning line over the ROI, and areas 1204 and 1204' indicated by solid lines represent the positions of the ROI at scanning end time of an N-th scanning line.

As shown in subfigure E, if scanning is assumed to be started when the first scanning line 1205 reaches the left edge of the field of view M, then depending on the velocity of stage movement, the line to be scanned may exceed the field of view M at a time when the N-th scanning line should be scanned. For example, if the ROI is at the position 1204' at a time when the N-th scanning line should be scanned, the N-th scanning line is at a position 1207 in subfigure F and outside the field of view M. Thus the image (pixel signal) of the N-th scanning line cannot be obtained.

The above bottleneck may be resolved by setting the velocity of stage movement in such a manner that image acquisition is started when the first scanning line 1205 enters the field of view M (at left edge of the field of view M) and terminated when the N-th scanning line is still within the field of view M, i.e., that the N-th scanning line is to the left of a position 1208 in subfigure F at scanning end time of the N-th scanning line. If plural ROIs are set in the field of view M as shown in FIG. 11, the completion of scanning over a given ROI is followed by a returning deflection in the opposite direction of stage movement so that scanning with primary charged particle beam may be started from the first scanning line of the next ROI.

As will be understood intuitively from FIG. 12, the velocity of stage movement V for high-velocity inspection cannot be increased indefinitely; the velocity is constrained by the ratio of the size M of the field of view to the length L of the ROI (area of the ROI in essence). Equation (1) given below represents this constraint. Equation (1) indicates that when an imaging area having the length L is set in the field of view having the size M, the velocity of stage movement cannot be made higher than what is shown on the right side of Equation (1) if an image of the entire imaging area is desired to be taken.

$$V \leq ((L+M)/L)V_0 \qquad (1)$$

Meanwhile, the upper limit on the velocity of stage movement is further constrained by the length L of the ROI and by the array pitch P in the direction of stage movement. Equation (2) below represents this constraint.

$$V(P/L)V_0 \qquad (2)$$

Equations (1) and (2) are easy to understand if a scanning skip area is assumed to be set between the ROIs of which the image is to be obtained. The longer the length of the skip area, the higher the velocity of stage movement can be made. Conversely, the greater the width of the ROI, the lower the velocity of stage movement needs to be made. Thus the velocity of stage movement is set in keeping with the ratio between the width of the scanning area and the skip area.

As shown in subfigure B in FIG. 11, L standing for the length of the ROI 1106 and P for the array pitch in the direction of stage movement, the size of the scanning skip area is given by P−L. Denoting the scanning skip interval as S, S is expressed as S=P−L. If this equation is rearranged into P=S+L and inserted into Equation (2), we get:

$$V((L+S)/L)V_0. \qquad (3)$$

This equation is apparently equivalent to Equation (1). That is, the Equations (1) and (2) signify that the maximum value of the scanning skip area is M, i.e., that the condition for allowing the first and the last scanning lines over the ROI to fall into the same field of view M is the upper limit being set on the scanning skip area over which the beam is to be applied for scanning continuously. If the scanning skip area is larger than that value, the beam cannot be applied for scanning continuously. In this case, the position of beam deflection is returned to the left edge of the field of view M (edge opposite to the direction of stage movement) after the last scanning line is scanned, and scanning is resumed when the first scanning line of the next ROI comes into the field of view.

Thus if the scanning skip area is set to be larger than the size M of the field of view, then there occurs a wait time that elapses before the first scanning line of the next ROI comes into the field of view. This reduces the inspection area dimensions per unit time, i.e., lowers the velocity of inspection.

If it is assumed that σ stands for the pixel size of the inspection image and N for the number of scanning lines arrayed in the ROI, then L=GN. Thus Equation (1) may also be interpreted to indicate that the velocity of stage movement is set in keeping with the length of the size of the field of view in the direction of stage movement, with the pixel size, and with the number of scanning lines in the ROI. Likewise, Equation (3) may also be interpreted to indicate that the velocity of stage movement is set in keeping with the length of the scanning skip area in the direction of stage movement, with the pixel size, and with the number of scanning lines in the ROI.

In actual operation, a time period is required in which the beam is returned over the distance M in the opposite direction of stage movement between the ROIs. It is also necessary to consider the variance of the stage velocity. Therefore it is difficult in practice to set the stage velocity to $((L+S)/L)V_0$. The actual stage velocity is set in consideration of the above-mentioned beam returning time and stage velocity variance.

Furthermore, Equation (3) may be rearranged into Equation (4) below.

$$V - V_0 = \Delta N = (S/L)V_0 \qquad (4)$$

This equation indicates that the amount of the increase from $V_0$ in the velocity of stage movement during ROI inspection is determined in keeping with the ratio between the skip area length and the ROI length or with the ratio between the size M of the field of view and the ROI length. From these findings, it can also be seen that if the number of ROIs or their size is increased in the field of view M, then the velocity of stage movement needs to be lowered correspondingly.

The control of stage movement explained above is performed by the stage controller 12.

Next, the control of beam deflection for high-velocity inspection is explained.

As explained above in conjunction with Equation (2), the method of inspection with high-velocity movement uses the beam deflection in the direction of stage movement in addition to the control of beam deflection in the direction intersecting the direction of stage movement, whereby beam scanning over desired inspection areas is implemented.

When plural ROIs are set in the field of view M, after completion of scanning over a given ROI, the applied position of primary charged particle beam is moved to the first scanning line of the next ROI by beam deflection in the direction of stage movement or in the opposite direction thereof. In the case of high-velocity stage movement of this embodiment, the stage-movement velocity V is asynchronous with beam deflection, so that the applied position of the beam is displaced from the scanning lines to be originally applied within one ROI.

Thus with the inspection device of this embodiment, the beam scanning controller 11 performs control to deflect the applied position of the primary charged particle beam in the same direction as that of stage movement, thereby eliminating the displacement of the applied position of the electron beam from the positions to be originally applied.

If it is assumed here that U stands for the velocity of deflection in the direction of stage movement and $\alpha$ ($\alpha>1$) for the ratio between the stage velocity V set for high-velocity inspection and the stage velocity $V_0$ synchronous with beam deflection, then an appropriate deflection velocity is given by the following Equation:

$$U=(\alpha-1)V_0. \tag{5}$$

The significance of this Equation in physical terms is evident considering the relative velocity of the applied position of the beam in the direction of stage movement. Because $V-U=V-(\alpha-1)V_0=V-(V/V_0-1)V_0=V_0$, the deflection velocity is set in such a manner that the relative velocity of the applied position of the beam moving in the direction of stage movement becomes equal to synchronous velocity. If the relative velocity is equal to synchronous velocity, then the applied position of the beam shifts by one pixel in the direction of stage movement while one scanning line is being scanned in the direction intersecting the stage-movement direction. This makes it possible to absorb the position displacement.

The above-mentioned displacement increases as repeated scanning advances from the first scanning line to the N-th scanning line. Thus the amount of beam shift caused by deflection also increases as scanning progresses within the ROI.

Figure 13:
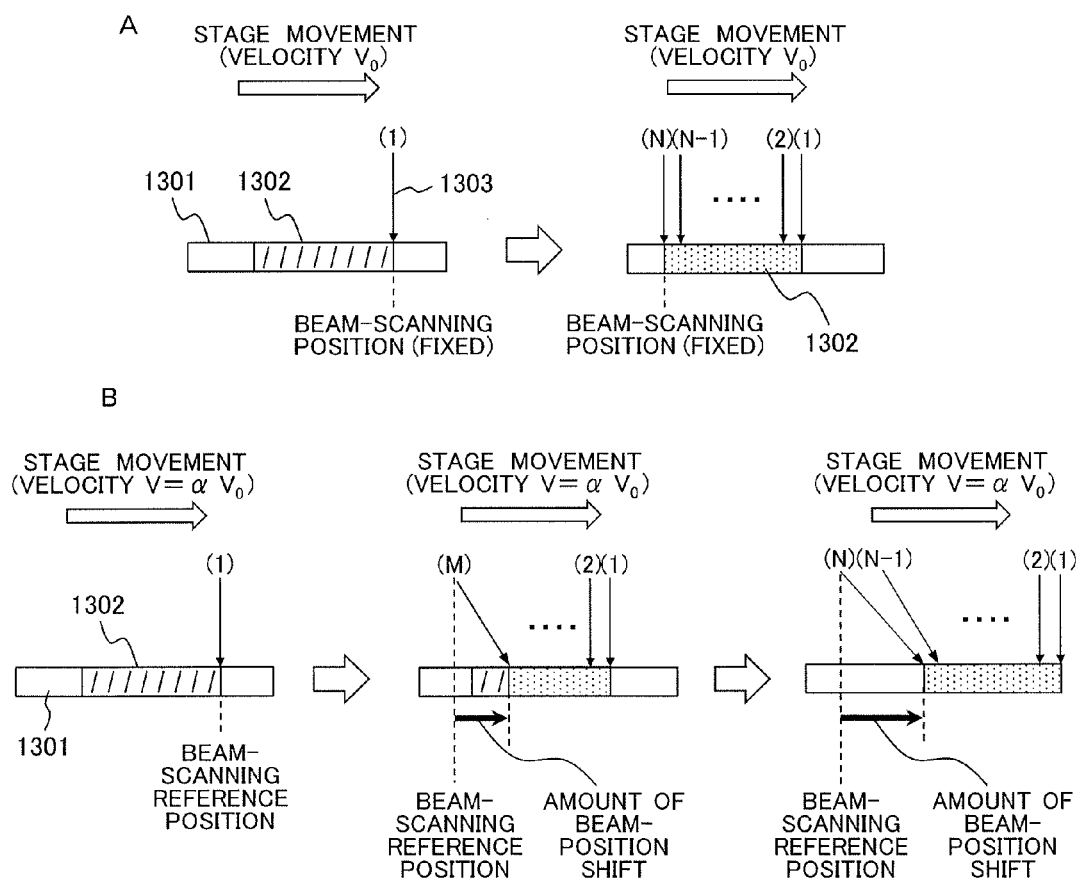
FIG. 13 is a schematic view showing relations between positions of scanning lines and amounts of the beam shift in the ROI area.

FIG. 13 shows how the amount of beam shift caused by deflection increases as scanning advances in the ROI, compared with how inspection is performed at the normal velocity of stage movement.

Subfigures A and B in FIG. 13 are side views showing laterally how an inspection area 1302 is set over a specimen 1301, with as many as N scanning lines set within the area. A hatched inspection area 1302 on the left in subfigure A is indicated as an area where beam irradiation has yet to be terminated. A solid-filled inspection area 1302 on the right in subfigure A is indicated as an area where beam irradiation is completed.

In the case of inspection at the normal velocity of stage movement, the beam deflection velocity is synchronized with the stage-movement velocity as shown in subfigure A in FIG. 13. In that case, no significant displacement occurs from scanning over fixed beam-scanning positions only. However, in the case of high-velocity inspection at an asynchronous stage velocity, there is no displacement along the first scanning line as shown on the left in subfigure B in FIG. 13. On an M-th scanning line (M is an integer, 1<M<N), as shown at the center in subfigure B, the amount of shift is as many as M($\alpha-1$) lines. On the last N-th scanning line, as shown on the right in subfigure B, the amount of shift is as many as N($\alpha-1$) lines. Denoting the pixel size as $\sigma$, the amount of beam shift is N($\alpha-1$)$\sigma$. The beam scanning controller 11 matches the applied position of the beam with the target position by carrying out beam deflection by only the above-described amount of shift within the same ROI.

As discussed above, the displacement of beam irradiation in the direction of stage movement increases as repeated scanning advances inside the ROI, so that the deflection distance (beam deflection angle of deflector 6) necessary for displacement correction becomes longer. Thus the longer the beam deflection distance of the deflector, the more advantageous the deflector is for boosting the velocity of stage movement.

The size M of the field of view can be enlarged theoretically to a maximum beam deflection distance of the deflector. In practice, however, the size is constrained by such conditions as off-axial astigmatism and the need to minimize image quality degradation due to field curvature aberration. Thus in actual operation of the device, images of a standard specimen are obtained by varying the size M of the field of view to determine the conditions under which such adverse effects as astigmatism and distortion are substantially the same from one image to another. Information about the size M of the field of view thus determined is stored into the control PC 14 and referenced by the beam controller 11 upon inspection.

According to the embodiment discussed above, it is possible to implement an inspection device capable of performing inspection in the step of making contact holes on the NAND type flash memory at a significantly higher velocity than before. Obviously, the inspection device of this embodiment can also be applied to inspection of not only the NAND type flash memory but also such semiconductor memory devices as NOR type flash memories and DRAMs as well as logic ICs and the substrates for driving liquid crystal displays.

While the present invention has been described in conjunction with specific embodiments, these embodiments should not be construed as limiting the scope of this invention. It is to be understood that changes, variations and combinations of the embodiments may be made without departing from the spirit or scope of the claims that follow.

Explanation Of Reference Characters
1 Column
2 XY stage
3 Electron gun
4 Condenser lens
5 Objective lens
6 Deflector
7 Secondary electron detector
8 Wafer
9 electron beam
10 Secondary electrons
11 Beam scanning controller
12 Stage controller
13 Image processing unit
14 Control PC 21 electron beam
22 Wafer
23 Arrow indicating the direction of stage movement
24 Arrow indicating electron beam scan
25 Swath
26a, 26b, 26c Inspection areas
27 Broken line indicating the center of the swath
28 X deflection signal
29 Y deflection signal
31 Swath
32, 33, 34, 35 Inspection areas
36 Broken line indicating the center of the swath
37 X deflection signal
38 Y deflection signal
39a, 39b, 39c, 39d Arrows indicating electron beam scan
41 Swath
42, 43, 44, 45 Inspection areas
46 Broken line indicating the center of the swath
47 X deflection signal
48 Y deflection signal
49a, 49b, 49c, 49d Arrows indicating electron beam scan
51 Swath
52 Memory mat
53 Peripheral circuit area
54 Peripheral circuit area
55 Broken line indicating the center of the swath
56 X deflection signal
57 Y deflection signal
58a, 58b, 58c, 58d, 58e, 58f, 59g, 59h, 59i, 59j Arrows indicating electron beam scan
61 Swath
62 Memory mat
63 Mat circumference neighborhood
64 Broken line indicating the center of the swath
65 X deflection signal
66 Y deflection signal
67a, 67b, 67c, 67d, 67e, 67f, 67g, 67h Arrows indicating electron beam scan
71 Swath
72, 73, 74, 75 Inspection areas
76 Broken line indicating the center of the swath
77 X deflection signal
78 Y deflection signal
81 Swath
82, 83, 84, 85 Inspection areas
86 Broken line indicating the center of the swath
87 X deflection signal
88 Y deflection signal
91 Swath
92, 93 Inspection areas
94 Broken line indicating the center of the swath
95 X deflection signal
96 Y deflection signal
97a, 97b, 97c, 97d, 97e, 97f, 97g, 97h Arrows indicating electron beam scan
101 Swath
102, 103, 104 Inspection areas
102a, 102b, 102c, 103a, 103b, 103c, 104a, 104b, 104c Arrows indicating electron beam scan
105 Broken line indicating the center of the swath
106 X deflection signal
107 Y deflection signal
108 Continuous scanning signal
109 Offset signal

What is claimed is:

1. A circuit-pattern inspection device for inspecting a circuit pattern formed on a substrate by obtaining an image of an area for inspection in a swath that is formed virtually by a predetermined width of electron-beam movement and by continuous stage-movement, the circuit-pattern inspection device comprising:
    a stage for moving the substrate on which the circuit pattern is formed;
    an electron-beam scanning unit for applying an electron beam over the substrate for scanning;
    a stage controller for controlling movement of the stage; and
    a beam scanning controller for controlling the electron-beam scanning unit;
    wherein an image of any area for inspection that is set within the swath is obtained by employing a combination of an electron-beam-deflection control in a first direction parallel to a direction of the movement of the stage and an electron-beam-deflection control in a second direction intersecting the first direction.

2. The circuit-pattern inspection device according to claim 1,
    wherein the image of the area for inspection is obtained while the velocity of the movement of the stage is maintained.

3. The circuit-pattern inspection device according to claim 1,
    wherein either a time margin or a distance margin is set for an edge of the set area for inspection, and electron-beam scanning over the area for inspection is started or ended earlier by the set margin.

4. The circuit-pattern inspection device according to claim 1,
    wherein the stage controller moves the stage at a velocity higher than a velocity of scanning with the electron beam.

5. The circuit-pattern inspection device according to claim 1,
    wherein, if a longitudinal direction of the area for inspection is parallel to the movement of the stage, the electron beam is applied for scanning in a direction parallel to the first direction to obtain the image of the area for inspection; and
    wherein, if the longitudinal direction of the area for inspection intersects the movement of the stage, the electron beam is applied for scanning in a direction parallel to the second direction to obtain the image of the area for inspection.

6. The circuit-pattern inspection device according to claim 1,
    wherein, if a longitudinal direction of the area for inspection intersects the movement of the stage, the electron beam is applied for scanning in a direction parallel to the first direction to obtain the image of the area for inspection; and
    wherein, if the longitudinal direction of the area for inspection is parallel to the movement of the stage, the electron beam is applied for scanning in a direction parallel to the second direction to obtain the image of the area for inspection.

7. The circuit-pattern inspection device according to claim 1,
    wherein electron-beam scanning is performed a plurality of times over the same area for inspection, and the images obtained from the scans are integrated to provide an inspection image.

8. The circuit-pattern inspection device according to claim 1,
wherein a pre-scan and a main scan are performed over the same area for inspection.

9. The circuit-pattern inspection device according to claim 8,
wherein a scanning length with the electron beam in the first direction or the second direction is set according to a size of an area set for the pre-scan and a size of an area set for the main scan.

10. The circuit-pattern inspection device according to claim 8,
wherein a wait time to suspend the scanning is set between the pre-scan and the main scan.

11. The circuit-pattern inspection device according to claim 1,
wherein a longitudinal direction of the area for inspection is determined from an image or design information being obtained in advance and regarding the area for inspection set within the swath; and
wherein the circuit-pattern inspection device further comprises a computing unit for deciding a direction of electron-beam scanning in the area for inspection set within the swath based on a result of the determination of the longitudinal direction.

12. The circuit-pattern inspection device according to claim 1, further comprising:
a scanning sequencer for performing the electron-beam-deflection control in the first direction and the second direction.

13. The charged particle beam device according to claim 1,
wherein the stage controller sets the velocity of the movement of the stage in a way that a scanning end edge of a first area included in the area for inspection and a scanning start edge of a second area of which an image is obtained subsequent to the first area fall within a field of view in which aberration and distortion are regarded to be equal within a range of scanning of the charged particle beam in the direction of the movement of the stage.

14. The charged particle beam device according to claim 1,
wherein the stage controller controls the stage to move at a velocity asynchronous with a deflection velocity of the electron beam, and
wherein the electron-beam scanning unit deflects the electron beam in the first direction at a deflection velocity corresponding to a difference between the velocity of the movement of the stage asynchronous with the deflection velocity of the electron beam and the velocity of the movement of the stage to move at a velocity synchronous with the deflection velocity of the electron beam.

15. A circuit-pattern inspection device for inspecting a circuit pattern formed on a substrate by obtaining an image of an area for inspection in a swath that is formed virtually by a predetermined width of electron-beam movement and by continuous stage-movement, the circuit-pattern inspection device comprising:
a stage for moving the substrate on which the circuit pattern is formed;
an electron-beam scanning unit for applying an electron beam over the substrate for scanning;
a stage controller for controlling movement of the stage; and
a beam scanning controller for controlling the electron-beam scanning unit;
wherein only an image of any area for inspection that is set within the swath is obtained by employing a combination of an electron-beam-deflection control in a first direction parallel to a direction of the movement of the stage and an electron-beam-deflection control in a second direction intersecting the first direction.

* * * * *